(12) United States Patent
Kitagawa et al.

(10) Patent No.: US 8,680,561 B2
(45) Date of Patent: Mar. 25, 2014

(54) SEMICONDUCTOR LIGHT EMITTING DEVICE AND METHOD FOR MANUFACTURING SAME

(75) Inventors: Ryota Kitagawa, Tokyo (JP); Akira Fujimoto, Kanagawa (JP); Koji Asakawa, Kanagawa (JP); Eishi Tsutsumi, Kanagawa (JP); Takanobu Kamakura, Kanagawa (JP); Shinji Nunotani, Tokyo (JP); Masaaki Ogawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 278 days.

(21) Appl. No.: 13/037,914

(22) Filed: Mar. 1, 2011

(65) Prior Publication Data

US 2012/0056222 A1    Mar. 8, 2012

(30) Foreign Application Priority Data

Sep. 6, 2010   (JP) ................... 2010-199330

(51) Int. Cl.
*H01L 33/00*   (2010.01)
(52) U.S. Cl.
USPC .............. 257/99; 257/103; 257/94; 257/95; 257/96; 257/E33.005
(58) Field of Classification Search
USPC .......... 257/95, 100, 103, 81, 98, 99, E33.074
See application file for complete search history.

(56) References Cited

U.S. PATENT DOCUMENTS

| | | | | |
|---|---|---|---|---|
| 5,153,889 A | * | 10/1992 | Sugawara et al. | 372/45.01 |
| 5,779,924 A | * | 7/1998 | Krames et al. | 216/24 |
| 6,258,618 B1 | * | 7/2001 | Lester | 438/46 |
| 6,881,985 B2 | * | 4/2005 | Murakami et al. | 257/99 |
| 6,900,473 B2 | * | 5/2005 | Yoshitake et al. | 257/95 |
| 6,998,649 B2 | | 2/2006 | Hata | |
| 7,488,989 B2 | * | 2/2009 | Nitta et al. | 257/95 |

(Continued)

FOREIGN PATENT DOCUMENTS

| JP | 2003-243726 A | 8/2003 |
|---|---|---|
| JP | 2006-135311 A | 5/2006 |
| JP | 2009-231689 A | 10/2009 |
| WO | WO 2010/095297 A1 | 8/2010 |

OTHER PUBLICATIONS

U.S. Appl. No. 13/037,154, filed Mar. 1, 2011, Masunaga et al.
U.S. Appl. No. 13/037,864, filed Mar. 1, 2011, Kitagawa et al.

(Continued)

*Primary Examiner* — Zandra Smith
*Assistant Examiner* — Tsz Chiu
(74) *Attorney, Agent, or Firm* — Oblon, Spivak, McClelland, Maier & Neustadt, L.L.P.

(57) ABSTRACT

A semiconductor light emitting device includes a first semiconductor layer of a first conductivity type, a second semiconductor layer of a second conductivity type, a light emitting layer, a first electrode layer, and a second electrode layer. The light emitting layer is between the first semiconductor layer and the second semiconductor layer. The first electrode layer is on a side of the second semiconductor layer opposite to the first semiconductor layer. The first electrode layer includes a metal portion and a plurality of opening portions piercing the metal portion along a direction from the first semiconductor layer toward the second semiconductor layer. The metal portion contacts the second semiconductor layer. An equivalent circular diameter of a configuration of the opening portions as viewed along the direction is not less than 10 nanometers and not more than 5 micrometers.

10 Claims, 14 Drawing Sheets

(56) References Cited

U.S. PATENT DOCUMENTS

| | | | |
|---|---|---|---|
| 7,745,843 B2 * | 6/2010 | Baba et al. | 257/98 |
| 8,357,557 B2 * | 1/2013 | Fujimoto et al. | 438/42 |
| 2009/0242925 A1 | 10/2009 | Kitagawa et al. | |

OTHER PUBLICATIONS

U.S. Appl. No. 13/037,990, filed Mar. 1, 2011, Asakawa et al.
U.S. Appl. No. 13/037,937, filed Mar. 1, 2011, Fujimoto et al.
U.S. Appl. No. 12/712,693, filed Feb. 25, 2010, Fujimoto et al.
Office Action issued Aug. 27, 2012 in Japanes Patent Application No. 2010-199330 (with English-language translation).
Office Action issued Jan. 21, 2013 in Japanese Application No. 2010-199330 (With English Translation).
U.S. Appl. No. 13/221,319, filed Aug. 30, 2011, Masunaga, et al.
Office Action (with English translation) issued on Nov. 25, 2013, in counterpart Japanese Appln No. 2013-089801 (4 pages).

* cited by examiner

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-199330, filed on Sep. 6, 2010; the entire contents of which are incorporated herein by reference.

FIELD

Embodiments described herein relate generally to a semiconductor light emitting device and a method for manufacturing the same.

BACKGROUND

To increase the luminance of a semiconductor light emitting device, it is important to increase the internal quantum efficiency of the semiconductor light emitting device, increase the light extraction efficiency, and increase the chip size. Conceivable methods to efficiently inject current into a large chip include a method of using a transparent electrode such as a conductive oxide as the electrode layer and a method of using a metal film having ultra-fine openings as the electrode layer. In semiconductor light emitting devices, there is room for improvement for even higher luminance.

DETAILED DESCRIPTION

Figure 1A:
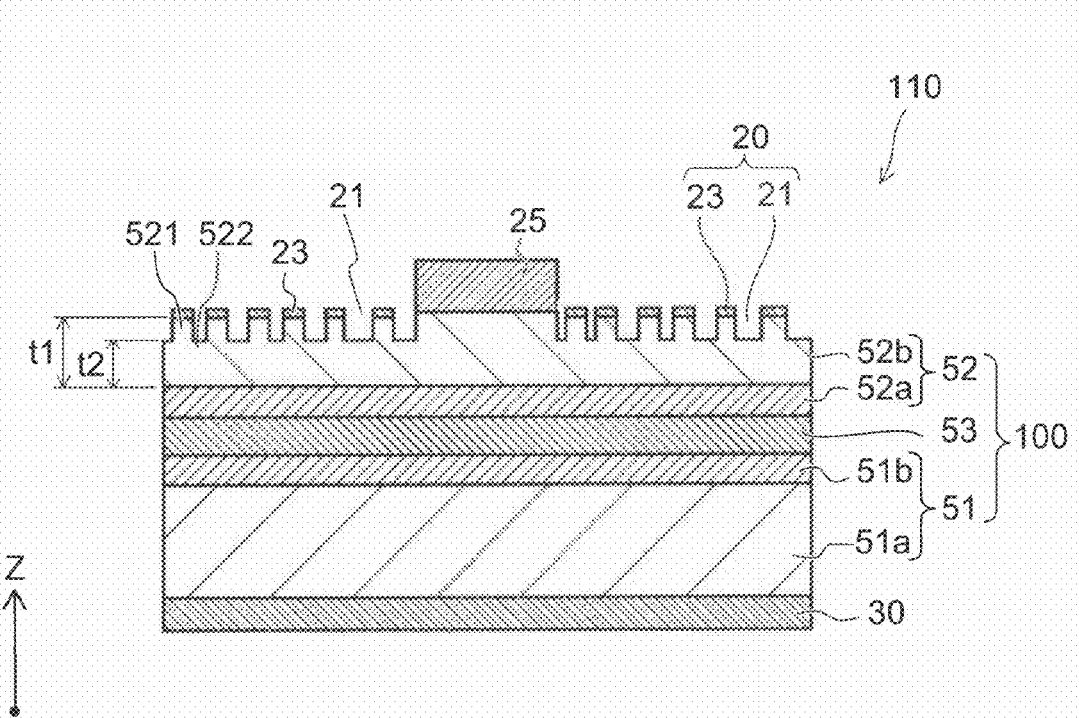
FIGS. 1A and 1B are schematic views illustrating the configuration of a semiconductor light emitting device according to a first embodiment.

In general, according to one embodiment, a semiconductor light emitting device includes a first semiconductor layer of a first conductivity type, a second semiconductor layer of a second conductivity type, a light emitting layer, a first electrode layer, and a second electrode layer. The light emitting layer is provided between the first semiconductor layer and the second semiconductor layer.

The first electrode layer is provided on a side of the second semiconductor layer opposite to the first semiconductor layer. The first electrode layer includes a metal portion and a plurality of opening portions piercing the metal portion along a direction from the first semiconductor layer toward the second semiconductor layer. The metal portion contacts the second semiconductor layer. An equivalent circular diameter of a configuration of each of the plurality of opening portions as viewed along the direction is not less than 10 nanometers and not more than 5 micrometers.

The second electrode layer is electrically connected to the first semiconductor layer.

The second semiconductor layer includes a protruding portion contacting the metal portion and a recessed portion recessed from the protruding portion along the direction at a bottom portion of the opening portion.

According to another embodiment, a semiconductor light emitting device includes a first semiconductor layer of a first conductivity type, a second semiconductor layer of a second conductivity type, a light emitting layer, a first electrode layer, and a second electrode layer. The light emitting layer is provided between the first semiconductor layer and the second semiconductor layer.

The second semiconductor layer includes a recessed portion and a protruding portion. The recessed portion is provided on a side of the second semiconductor layer opposite to the first semiconductor layer. The protruding portion protrudes from the recessed portion along a direction from the first semiconductor layer toward the second semiconductor layer. An equivalent circular diameter of a configuration of the protruding portion as viewed from the direction is not less than 10 nanometers and not more than 5 micrometers.

The first electrode layer includes a metal portion filled into the recessed portion.

The second electrode layer is electrically connected to the first semiconductor layer.

Further, a method is disclosed for manufacturing a semiconductor light emitting device. The method can include forming a first semiconductor layer of a first conductivity type, forming a light emitting layer on the first semiconductor layer, forming a second semiconductor layer of a second conductivity type on the light emitting layer, and forming a metal layer on the second semiconductor layer. The method can include forming a mask pattern on the metal layer. In addition, the method can include forming an electrode layer including a plurality of opening portions by etching the metal layer using the mask pattern as a mask, and making a recessed portion recessed from a bottom portion of the plurality of opening portions by etching the second semiconductor layer. An equivalent circular diameter of the plurality of opening portions is not less than 10 nanometers and not more than 5 micrometers.

According to yet another embodiment, a method is disclosed for manufacturing a semiconductor light emitting device. The method can include forming a first semiconductor layer of a first conductivity type, forming a light emitting layer on the first semiconductor layer, and forming a second semiconductor layer of a second conductivity type on the light emitting layer. The method can include forming a mask pattern on the second semiconductor layer. The method can include making a recessed portion in the second semiconductor layer by etching the second semiconductor layer using the mask pattern as a mask, and forming a protruding portion to protrude from the recessed portion along a direction from the first semiconductor layer toward the second semiconductor layer. An equivalent circular diameter of a configuration of the protruding portion as viewed from the direction is not less than 10 nanometers and not more than 5 micrometers. In addition, the method can include filling a metal layer into the recessed portion.

Embodiments of the invention will now be described based on the drawings.

The drawings are schematic or conceptual; and the relationships between the thicknesses and widths of portions, the proportional coefficients of sizes among portions, etc., are not necessarily the same as the actual values thereof. Further, the dimensions and the proportional coefficients may be illustrated differently among the drawings, even for identical portions.

In the specification and the drawings of the application, components similar to those described in regard to a drawing thereinabove are marked with like reference numerals, and a detailed description is omitted as appropriate.

First Embodiment

Figure 1B:
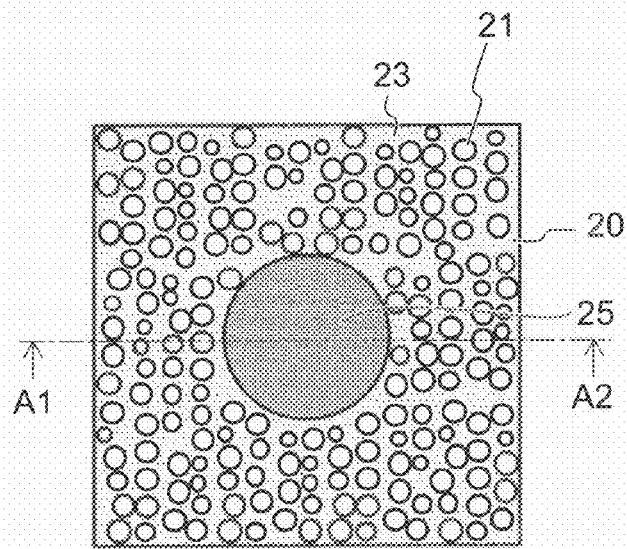

FIGS. 1A and 1B are schematic views illustrating the configuration of a semiconductor light emitting device according to a first embodiment.

FIG. 1B is a schematic plan view of the semiconductor light emitting device according to the first embodiment. FIG. 1A is a schematic cross-sectional view of the semiconductor light emitting device according to the first embodiment and is a cross-sectional view along line A1-A2 of FIG. 1B.

A semiconductor light emitting device 110 according to the first embodiment includes a first semiconductor layer 51, a second semiconductor layer 52, a light emitting layer 53, a first electrode layer 20, and a second electrode layer 30.

The first semiconductor layer 51 has a first conductivity type. The second semiconductor layer 52 has a second conductivity type. The light emitting layer 53 is provided between the first semiconductor layer 51 and the second semiconductor layer 52. Thus, the first semiconductor layer 51, the second semiconductor layer 52, and the light emitting layer 53 are stacked. The first semiconductor layer 51, the second semiconductor layer 52, and the light emitting layer 53 are referred to as a structural body 100.

Hereinbelow, for example, the first conductivity type is an n-type and the second conductivity type is a p-type. Or, the first conductivity type is the p-type and the second conductivity type is the n-type. Hereinbelow, the case is described where the first conductivity type is the n-type and the second conductivity type is the p-type.

The first semiconductor layer 51 includes, for example, a clad layer 51b of n-type InAlP. The clad layer 51b is formed, for example, on a substrate 51a of n-type GaAs. For convenience in the embodiment, the substrate 51a is taken to be included in the first semiconductor layer 51.

The second semiconductor layer 52 includes protruding portions 521 and recessed portions 522. The protruding portions 521 contact a metal portion 23 described below; and the recessed portions 522 are recessed from the protruding portions 521 along the Z direction at the bottom portions of multiple opening portions 21 described below.

The second semiconductor layer 52 includes, for example, a clad layer 52a of p-type InAlP. A current diffusion layer 52b of p-type InGaAlP, for example, is provided on the clad layer 52a. A contact layer may be provided as necessary on the current diffusion layer 52b. For convenience in the embodiment, the current diffusion layer 52b and the contact layer provided as necessary are taken to be included in the second semiconductor layer 52.

In the semiconductor light emitting device 110, for example, the clad layer 51b of the first semiconductor layer 51, the light emitting layer 53, and the clad layer 52a of the second semiconductor layer 52 form a heterostructure.

The first electrode layer 20 is provided on the side of the second semiconductor layer 52 opposite to the first semiconductor layer 51. In other words, the second semiconductor layer 52 is disposed between the first electrode layer 20 and the first semiconductor layer 51.

For convenience of description in the embodiment, the second semiconductor layer 52 side of the structural body 100 is taken as the front face side or the upper side; and the first semiconductor layer 51 side of the structural body 100 is taken as the back face side or the lower side. The direction from the first semiconductor layer 51 toward the second semiconductor layer 52 is taken as the Z direction.

The first electrode layer 20 includes the metal portion 23 that contacts the second semiconductor layer 52 and the multiple opening portions 21 that pierce the metal portion 23 along the Z direction. The equivalent circular diameter of each of the multiple opening portions 21 is not less than 10 nm and not more than 5 μm.

Herein, the equivalent circular diameter is defined by the following first formula (1).

$$\text{Equivalent circular diameter} = 2 \times (\text{Area}/\pi)^{1/2} \quad (1)$$

Herein, the "Area" is the area of the configuration of the opening portion 21 as viewed from the Z direction.

The opening portion 21 is not necessarily limited to being circular. Accordingly, in the embodiments, the opening portion 21 is designated using the definition of the equivalent circular diameter recited above.

A pad electrode 25 is provided on the first electrode layer 20. A bonding wire (not illustrated), for example, is connected to the pad electrode 25; and current is supplied from the bonding wire to the first electrode layer 20 via the pad electrode 25.

The second electrode layer 30 is electrically connected to the first semiconductor layer 51. In this example, the second electrode layer 30 is provided on the back face side of the structural body 100. In other words, the first semiconductor layer 51 is disposed between the second electrode layer 30 and the light emitting layer 53. The second electrode layer 30 includes, for example, Au.

In the semiconductor light emitting device 110, the light (the emitted light) emitted from the light emitting layer 53 is extracted to the outside from the surface (the upper face) of the second semiconductor layer 52 which is the current diffusion layer on which the first electrode layer 20 is provided. In other words, the surface of the second semiconductor layer 52 on which the first electrode layer 20 is provided is the light extraction face.

In the semiconductor light emitting device 110 according to the embodiment, a first thickness t1 along the Z direction of the protruding portions 521 of the second semiconductor layer 52 contacting the metal portion 23 is different from a second thickness t2 along the Z direction of the current diffusion layer 52b up to the recessed portions 522 corresponding to the multiple opening portions 21 of the second semiconductor layer 52.

In the semiconductor light emitting device 110 illustrated in FIGS. 1A and 1B, the first thickness t1 is thicker than the second thickness t2.

In other words, the portion of the second semiconductor layer 52 on the first electrode layer 20 side has an uneven configuration. The metal portion 23 described below is provided on the protruding portions of the uneven configuration. The recessed portions 522 correspond to the multiple opening portions 21.

The extraction efficiency of the light emitted from the light emitting layer 53 to the outside is higher in the case that the second semiconductor layer 52 has such an uneven configuration than in the case that the uneven configuration is not provided.

In other words, as described below, the first electrode layer 20 including the metal portion 23 and the opening portions 21 is formed by, for example, forming a metal film used to form the metal portion 23 on the second semiconductor layer 52 and subsequently making the opening portions 21 by removing the portions where the opening portions 21 are to be made.

According to various experiments of the inventors, it was ascertained that a portion having a low optical transmission (a low transmission portion, i.e., a light absorption layer) forms on the portion of the second semiconductor layer 52 contacting the metal film when the metal film is formed on the surface of the second semiconductor layer 52. In particular, the low transmission portion (the light absorption layer) is formed in the contact interface during an annealing to obtain the ohmic contact between the second semiconductor layer 52 and the metal film.

It was ascertained that the light extraction efficiency of the semiconductor light emitting device decreases because the low transmission portion remains in the case that the low transmission portion contacting the metal film is not removed by removing the metal film of the portions where the opening portions 21 are made after the forming of the metal film on the second semiconductor layer 52.

The embodiment focuses on such newly discovered problems. According to experiments of the inventors, it was determined that the light extraction efficiency of the semiconductor light emitting device is increased by forming the metal film on the second semiconductor layer 52, removing portions of the metal film where the opening portions 21 are to be made, and subsequently performing etching of the second semiconductor layer 52 exposed from the opening portions 21 to remove the low transmission portion of the second semiconductor layer 52.

The configuration of the embodiment is based on such experiments.

In other words, in the semiconductor light emitting device 110 according to the embodiment, the second thickness t2 along the Z direction of the recessed portions 522 of the second semiconductor layer 52 corresponding to the multiple opening portions is smaller than the first thickness t1 along the Z direction of the protruding portions 521 of the second semiconductor layer 52 contacting the metal portion 23. In other words, the low transmission portion recited above is removed at the recessed portions 522; and the second thickness t2 is smaller than the first thickness t1 by the amount of the removed thickness.

Thus, the metal portion 23 does not contact the recessed portions 522; and the light absorption layer is not provided in the recessed portions 522. Thereby, at the recessed portions 522, the light emitted from the light emitting layer 53 is emitted to the outside without being absorbed by the light absorption layer. Thereby, a high light extraction efficiency is obtained.

Moreover, because the second semiconductor layer 52 has the uneven configuration due to the protruding portions 521 and the recessed portions 522 in the semiconductor light emitting device 110, a sealing resin (not illustrated) covering the first electrode layer 20 enters into the uneven configuration which can increase the adhesion of the sealing resin.

One specific example of the semiconductor light emitting device 110 will now be described.

The semiconductor light emitting device 110 includes, for example, the substrate 51a of n-type GaAs; and a heterostructure including, for example, the clad layer 51b of n-type InAlP, the light emitting layer 53 of InGaP, and the clad layer 52a of p-type InAlP is formed on the substrate 51a. Herein, the substrate 51a may include sapphire, Si, SiN, SiC, ZnO, and the like in addition to GaAs.

The light emitting layer 53 may have a MQW (Multiple Quantum Well) configuration in which, for example, a barrier layer and a well layer are repeatedly provided alternately. The light emitting layer 53 may include a SQW (Single Quantum Well) configuration including one set of a well layer interposed between barrier layers. Or, the light emitting layer 53 may have a double heterostructure.

Then, the current diffusion layer 52b of p-type InGaAlP, for example, is formed on the light emitting layer 53. Thereby, current can be spread over the entire light emitting layer 53 to increase the efficiency. However, the embodiment is not limited thereto. The current diffusion layer 52b may be provided as necessary and may be omitted in some cases.

Such semiconductor layer configurations are examples; and the embodiment is not limited thereto.

A contact layer may be formed as necessary on the current diffusion layer 52b to increase the ohmic contact properties between the second semiconductor layer 52 and the first electrode layer 20. In particular, in the case that the current diffusion layer 52b is formed of multiple elements, e.g., is a layer made of three or more elements such as, for example, InGaAlP and AlGaAs, good ohmic contact is obtained by providing such a contact layer between the first electrode layer 20 and the current diffusion layer 52b.

Herein, the contact layer may include, for example, GaAs and GaP. However, the embodiment is not limited thereto. The material of the contact layer may be selected appropriately based on, for example, the material of the current diffusion layer 52b adjacent to the contact layer and the material of the first electrode layer 20.

In addition, the first semiconductor layer 51, the light emitting layer 53, and the second semiconductor layer 52 may include, for example, GaP, InGaAlP, AlGaAs, GaAsP, and the like and nitride semiconductors. The methods for manufacturing the first semiconductor layer 51, the light emitting layer 53, and the second semiconductor layer 52 may include, for example, metal organic chemical vapor deposition (MOCVD), molecular beam epitaxy (MBE), vapor phase epitaxy (VPE), liquid phase epitaxy (LPE), and the like.

One specific example of the first electrode layer 20 will now be described.

The first electrode layer 20 may include, for example, a multilayered metal film of Au and Au—Zn as the p-side electrode. The multiple opening portions 21 are provided in the first electrode layer 20 to pierce the metal portion 23 in the Z direction. The size and the disposition of each of the opening portions 21 may be regular or irregular.

The size of the multiple opening portions 21 may be set from the viewpoint of the current spread over the entire device surface, the heat dissipation, etc., in addition to light transmission characteristics. In other words, in the case that the opening portions 21 are larger than necessary, the light transmission characteristics of the first electrode layer 20 improve while the electrical resistance increases and the current spreads less easily over the entire first electrode layer 20. The surface area of the metal portion 23 is set appropriately also to increase the luminance by having sufficient heat dissipation and to reduce the operating voltage. In other words, the surface area of the metal portion 23 cannot be set to be too small.

Although depending also on the doping concentration and the like of the semiconductor layer in which the current flows, the range in which the current flows obtained by calculations of simulations, etc., is the range up to about 5 μm from the edge of the first electrode layer 20. In the case that the diameter of the opening portion 21 is about 5 μm or more, a range in which the current does not flow may occur in the opening portion 21; the series resistance may not decrease sufficiently; and the forward voltage may not decrease sufficiently. Therefore, the upper limit of the equivalent circular diameter of the opening portion 21 is not more than 5 μm. It is desirable for the equivalent circular diameter of the opening portion 21 to be not more than 1 μm.

In the embodiment, the luminance can be increased by providing the multiple opening portions 21 having the equivalent circular diameter recited above in the first electrode layer 20. In other words, the first electrode layer 20 including the multiple opening portions 21 is formed of a metal. Therefore, the conductivity is higher than that of the oxide transparent electrode such as a semiconductor or ITO (Indium Tin Oxide) of the current diffusion layer by a factor of 10 to 100. The thermal conductivity of the first electrode layer 20 is higher than those of semiconductors and oxide transparent electrodes. Therefore, the semiconductor light emitting device has a lower forward voltage (Vf) in the case that the first electrode layer 20 is used than in the case that ITO is used. As a result, current concentration in the light emitting layer 53 is mitigated; more uniform light emission is provided; and the luminance increases.

On the other hand, there are no constraints on the lower limit of the equivalent circular diameter of the opening portions 21 from the viewpoint of the resistance value. For ease of manufacturing, it is favorable for the equivalent circular diameter of the opening portions 21 to be not less than 10 nm. It is more desirable to be not less than 30 nm.

The metal portion 23 (the portion where the opening portions 21 are not provided) of the first electrode layer 20 is continuous between any two points from at least a current supply source such as the pad electrode 25. Thereby, it is possible to ensure the electrical conductivity and maintain a low resistance value.

In the case that multiple current supply sources are provided, it is sufficient for the metal portion 23 of the first electrode layer 20 to be continuous for each of the current supply sources.

It is also desirable for the metal portion 23 to be continuous to emit light uniformly from the light emitting surface of the semiconductor light emitting device 110. From the viewpoint of the resistance value of the first electrode layer 20, it is favorable for the sheet resistance of the first electrode layer 20 to be not more than 10Ω/□ and more favorable to be not more than 5Ω/□. The heat generation of the semiconductor light emitting device 110 decreases as the sheet resistance decreases. Also, uniform light emission and an increase of the luminance are pronounced.

From the viewpoint of the sheet resistance recited above, the thickness of the first electrode layer 20 is not less than 10 nm. On the other hand, the sheet resistance decreases as the thickness of the first electrode layer 20 increases. From the viewpoint of ensuring the transmission of the light produced by the light emitting layer 53, it is favorable for the upper limit of the thickness of the first electrode layer 20 to be not more than 50 nm.

It is desirable for the metal portion 23 of the first electrode layer 20 to include a material to obtain a sufficient ohmic contact with the second semiconductor layer 52. It is desirable for the metal portion 23 to include a material having sufficient electrical conductivity and thermal conductivity. It is favorable for the metal portion 23 to include a material having a base metal of at least one selected from Ag and Au from the viewpoint of the absorption loss. From the viewpoint of ensuring the adhesion and the heat resistance, it is desirable for the metal portion 23 to include at least one selected from the group consisting of Al, Zn, Zr, Si, Ge, Pt, Rh, Ni, Pd, Cu, Sn, C, Mg, Cr, Te, Se, and Ti or an alloy (or a compound) including at least two selected from the group. However, the embodiment is not limited thereto. The metal portion 23 may include any metal generally usable as an electrode.

The n-side second electrode layer 30 made of, for example, Au is formed on the back face side of the substrate 51a. The second electrode layer 30 is electrically connected to the first semiconductor layer 51.

The configuration of the protruding portion 521 of the second semiconductor layer 52 will now be described.

The configuration of the protruding portion 521 may be a circular columnar shape. Or, the configuration of the protruding portion 521 may be any one selected from circular conic, tapered, and reverse tapered having a tilted side face to provide a gradient to the refractive index in the Z direction. By having such a configuration, the refractive index from the surface of the semiconductor light emitting device 110 to the external medium changes continuously without discontinuities when the light is extracted from the light emitting layer 53 to the outside. Thereby, it is possible to prevent reflections of the light at the interface between the surface of the semiconductor light emitting device 110 and the external medium and efficiently extract the light to the outside.

It is desirable for the distance between two adjacent opening portions 21 of the multiple opening portions 21 corresponding to the recessed portions 522 to be as follows.

Namely, the following second formula (2) is satisfied, where the distance between two mutually adjacent opening portions 21 of the multiple opening portions 21 is d, the average of the distance d of each of the multiple opening portions 21 is Ad, the wavelength of the light emitted from the light emitting layer 53 is λ, the refractive index of the second semiconductor layer 52 with respect to the emitted light is n2, and the refractive index of the medium outside the second semiconductor layer 52 with respect to the emitted light is n0.

$$Ad \leq \lambda \times (2/(n2+n0)) \qquad (2)$$

The results of an optical simulation using rigorous coupled-wave analysis (RCWA) will now be described for the case that the recessed portions 522 of the second semiconductor layer 52 are made corresponding to the multiple opening portions 21.

In these calculations, the external medium of the semiconductor light emitting device 110 is taken to be air (refractive index n0=1.0); the light emission wavelength of the light produced by the light emitting layer 53 is taken to be 630 nm; the thickness of the first electrode layer 20 including the opening portions 21 is taken to be 30 nm; and the metal portion 23 is taken to be Au. The refractive index n2 of the current diffusion layer 52b (second semiconductor layer 52) is taken to be 3.3; and the difference between the first thickness t1 of the protruding portions 521 and the second thickness t2 of the recessed portions 522 is taken to be 300 nm.

Calculations were performed for conditions in which the average Ad was (a) 150 nm, (b) 300 nm, and (c) 600 nm. The second formula recited above is satisfied when the average Ad is 150 nm. The second formula recited above is not satisfied when the average Ad is 300 nm or 600 nm.

FIGS. 2A to 2D are graphs illustrating simulation results.

Figure 2A:
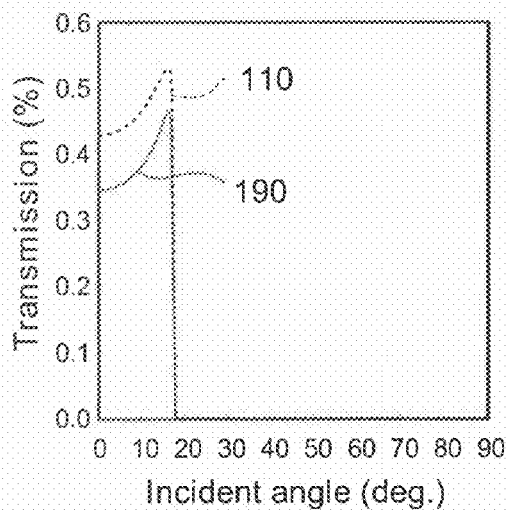
FIGS. 2A to 2D are graphs illustrating simulation results.
Figure 2B:
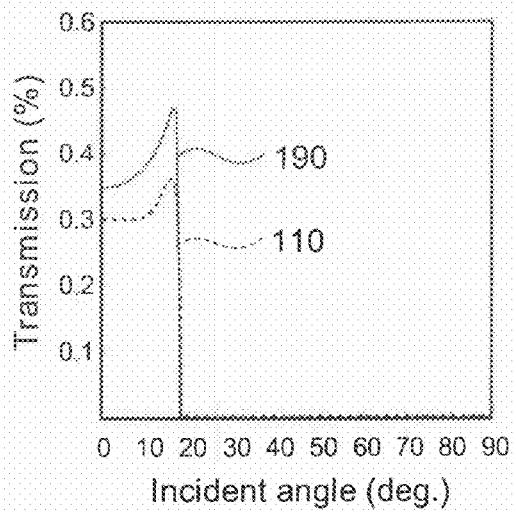

FIG. 2A illustrates the case that the average Ad is 150 nm; FIG. 2B illustrates the case that the average Ad is 300 nm; and FIG. 2C illustrates the case that the average Ad is 600 nm.

In each of the graphs, the horizontal axis illustrates the incident angle of the light; and the vertical axis illustrates the transmission of the light. Herein, as illustrated in FIG. 2D, the incident angle is the angle of the light from the Z direction, which is the direction from the light emitting layer 53 toward the second semiconductor layer 52. In each of the graphs, the simulation results are illustrated for the case of the semiconductor light emitting device 110 including the recessed portions 522 and the case of a semiconductor light emitting device 190 (a reference example) having no recessed portions.

As illustrated in FIG. 2A, the transmission inside the critical angle (0° to 20°) is higher for the case that the recessed portions 522 of the semiconductor light emitting device 110 are made such that the average Ad is 150 nm than for the semiconductor light emitting device 190 in which the recessed portions 522 are not made. This is because the transmission inside the critical angle increases in the case that the average Ad is 150 nm due to the occurrence of low-order (0th to 2nd order) diffractions.

Figure 2C:
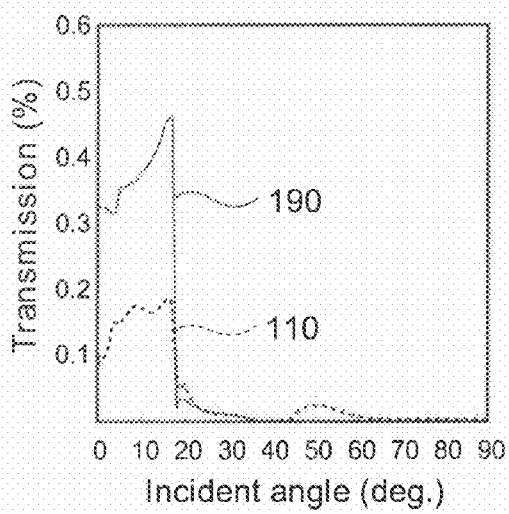
Figure 2D:
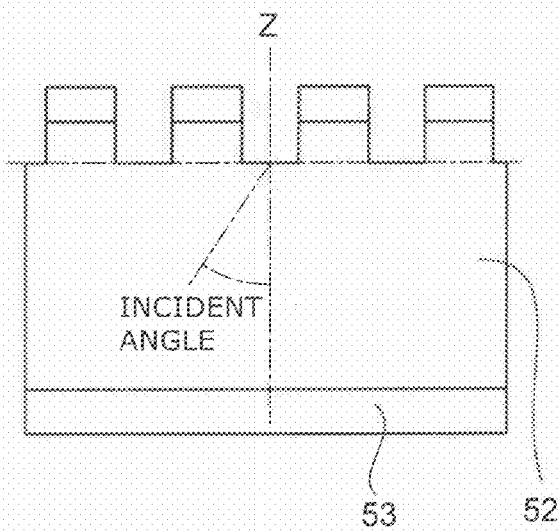

In the case that the average Ad is 300 nm as illustrated in FIG. 2B and in the case that the average Ad is 600 nm as illustrated in FIG. 2C, the diffraction order is third order or more; and the light emitted from the light emitting layer 53 undergoes total internal reflections by the recessed portions 522. As a result of the light undergoing the total internal reflections and being diffracted in directions outside the critical angle, the light is not easily transmitted outside the device.

These simulation results show that it is favorable when $Ad \leq \lambda \times (2/(n2+n0))$.

It is desirable for the difference between the first thickness t1 of the protruding portions 521 and the second thickness t2 of the recessed portions 522 to be not more than the wavelength of the light emitted from the light emitting layer 53. Thereby, it is possible to increase the diffraction efficiency. It is more desirable for the difference between the first thickness t1 and the second thickness t2 to be about the same as the light emission wavelength (e.g., within plus or minus 50% of the light emission wavelength). Thereby, it is possible to increase the diffraction efficiency further.

Second Embodiment

Figure 3A:
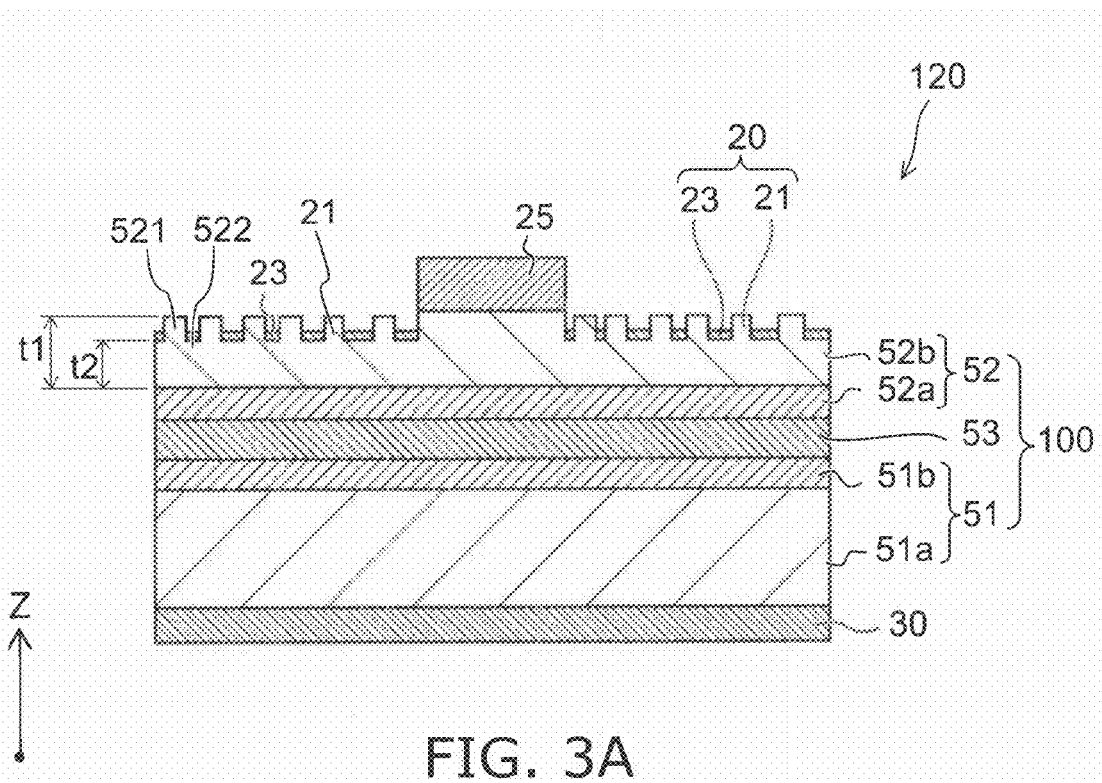
FIGS. 3A and 3B are schematic views illustrating the configuration of a semiconductor light emitting device according to a second embodiment.
Figure 3B:
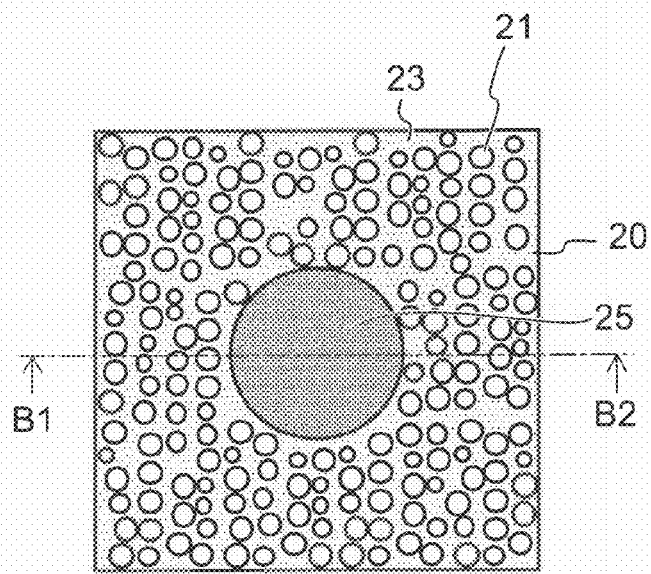

FIGS. 3A and 3B are schematic views illustrating the configuration of a semiconductor light emitting device according to a second embodiment.

FIG. 3B is a schematic plan view of the semiconductor light emitting device according to the second embodiment. FIG. 3A is a schematic cross-sectional view of the semiconductor light emitting device according to the second embodiment and is a cross-sectional view along line B1-B2 of FIG. 3B.

FIG. 3A is a schematic cross-sectional view of the semiconductor light emitting device according to the second embodiment; and FIG. 3B is a schematic plan view of the semiconductor light emitting device according to the second embodiment.

In the semiconductor light emitting device 120 according to the second embodiment, the second semiconductor layer 52 includes the protruding portions 521 and the recessed portions 522 provided on the side of the second semiconductor layer 52 opposite to the first semiconductor layer 51.

The protruding portions 521 protrude from the recessed portions 522 along the Z direction.

The equivalent circular diameter of the configuration of the protruding portions 521 as viewed from the Z direction is not less than 10 nanometers and not more than 5 micrometers.

The metal portion 23 of the first electrode layer 20 is filled into the recessed portions 522.

Thereby, the configuration of the portions where the metal portion 23 of the first electrode layer 20 is not provided as viewed from the Z direction is not less than 10 nanometers and not more than 5 micrometers. These portions become the opening portions 21 of the first electrode layer 20.

In a semiconductor light emitting device 120 according to the second embodiment as well, similarly to the semiconductor light emitting device 110 according to the first embodiment, the extraction efficiency of the light emitted by the light emitting layer 53 to the outside is higher than that of the case that an uneven configuration is not provided in the second semiconductor layer 52.

In other words, as described above, a portion having a low optical transmission (a low transmission portion, i.e., a light absorption layer) forms on the portion of the second semiconductor layer 52 contacting the metal portion 23 when the metal portion 23 is formed on the surface of the second semiconductor layer 52. In particular, the low transmission portion (the light absorption layer) is formed in the contact interface during an annealing to obtain the ohmic contact between the second semiconductor layer 52 and the metal portion 23.

In the embodiment, the metal portion 23 is formed in the recessed portions 522 of the second semiconductor layer 52. The metal portion 23 is not formed on the protruding portions 521 of the second semiconductor layer 52. Thereby, a low transmission portion is not formed on the protruding portions 521.

In other words, according to experiments of the inventor, it was determined that in the case that the metal portion 23 is formed on a portion of the second semiconductor layer 52 and the metal portion 23 is not formed on another portion of the second semiconductor layer 52, the light extraction efficiency of the semiconductor light emitting device increases because the low transmission portion does not form in the portion where the metal portion 23 is not formed. In other words, as described below, the metal portion 23 can be formed selectively in the recessed portions 522 by forming the metal portion 23 in the recessed portions 522 of the second semiconductor layer 52 in a state in which the protruding portions 521 of the second semiconductor layer 52 are covered with a mask material, etc. Then, a state in which the protruding portions 521 do not contact the metal portion 23 can be realized.

The configuration of the embodiment is based on such experiments.

In other words, in the semiconductor light emitting device 120 according to the embodiment, the first thickness t1 along the Z direction of the protruding portions 521 of the second semiconductor layer 52 is greater than the second thickness t2 along the Z direction of the current diffusion layer 52b up to the recessed portions 522 of the second semiconductor layer 52 contacting the metal portion 23. By such a configuration, the low transmission portion recited above does not form in the protruding portions 521.

Thus, the metal portion 23 does not contact a top of the protruding portions 521; and the light emitted from the light emitting layer 53 is emitted to the outside without being absorbed by the light absorption layer at the protruding portions 521. Thereby, a high light extraction efficiency is obtained.

Moreover, because the second semiconductor layer 52 has the uneven configuration due to the protruding portions 521 and the recessed portions 522 in the semiconductor light emitting device 120 according to the embodiment, a sealing resin (not illustrated) covering the first electrode layer 20 enters into the uneven configuration which can increase the adhesion of the sealing resin.

In the semiconductor light emitting device 120 according to the second embodiment as well, it is favorable for the second formula to be satisfied.

Now discussed is a method for manufacturing, for example, the semiconductor light emitting device 110.

Figure 4A:
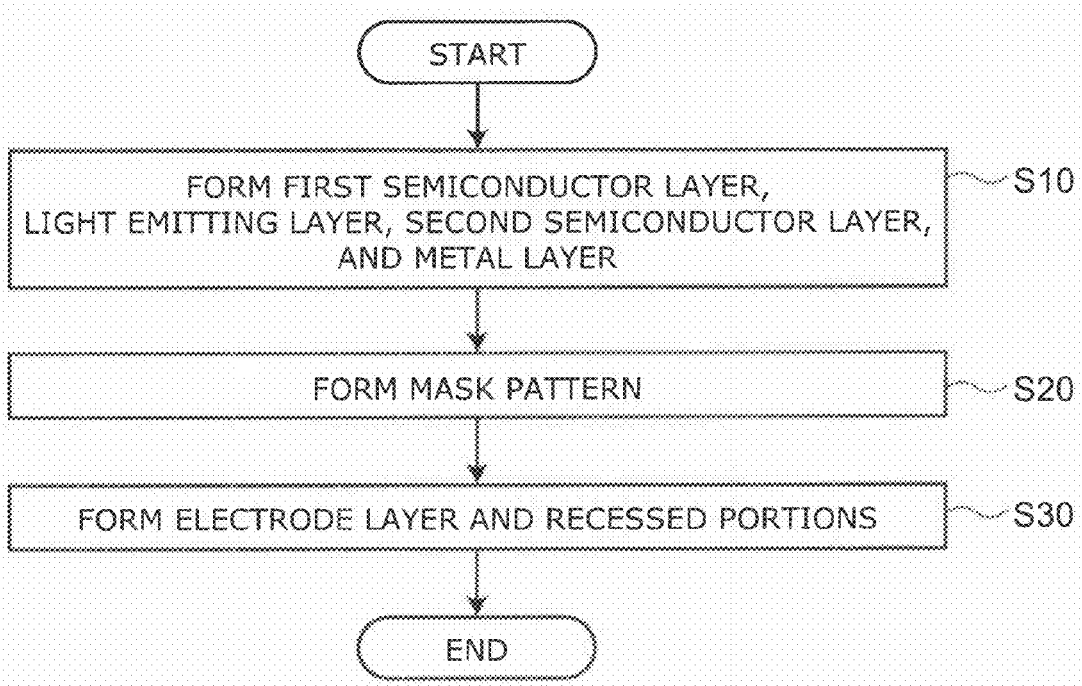
FIGS. 4A and 4B are flowcharts illustrating a method for manufacturing a semiconductor light emitting device.

FIG. 4A is a flowchart illustrating the method for manufacturing the semiconductor light emitting device 110.

In other words, this manufacturing method includes a process of forming the first semiconductor layer 51, forming the light emitting layer 53 on the first semiconductor layer 51, forming the second semiconductor layer 52 on the light emitting layer 53, and forming a metal layer on the second semiconductor layer 52 (step S10); a process of forming a mask material on the metal layer and forming a mask pattern in which multiple openings are provided in the mask material (step S20); and a process of forming an electrode layer (the first electrode layer 20) including the multiple opening portions 21 having an equivalent circular diameter not less than 10 nanometers and not more than 5 micrometers by etching the metal layer using the mask pattern as a mask, and making the recessed portions 522 at positions corresponding to the multiple opening portions 21 by etching the second semiconductor layer 52 using the remaining mask material as a mask (step S30).

According to this method for manufacturing the semiconductor light emitting device, it is possible to make the recessed portions 522 in the second semiconductor layer 52 by continuing from the processing that makes the multiple opening portions 21 of the first electrode layer 20.

Now discussed is a method for manufacturing, for example, the semiconductor light emitting device 120.

Figure 4B:
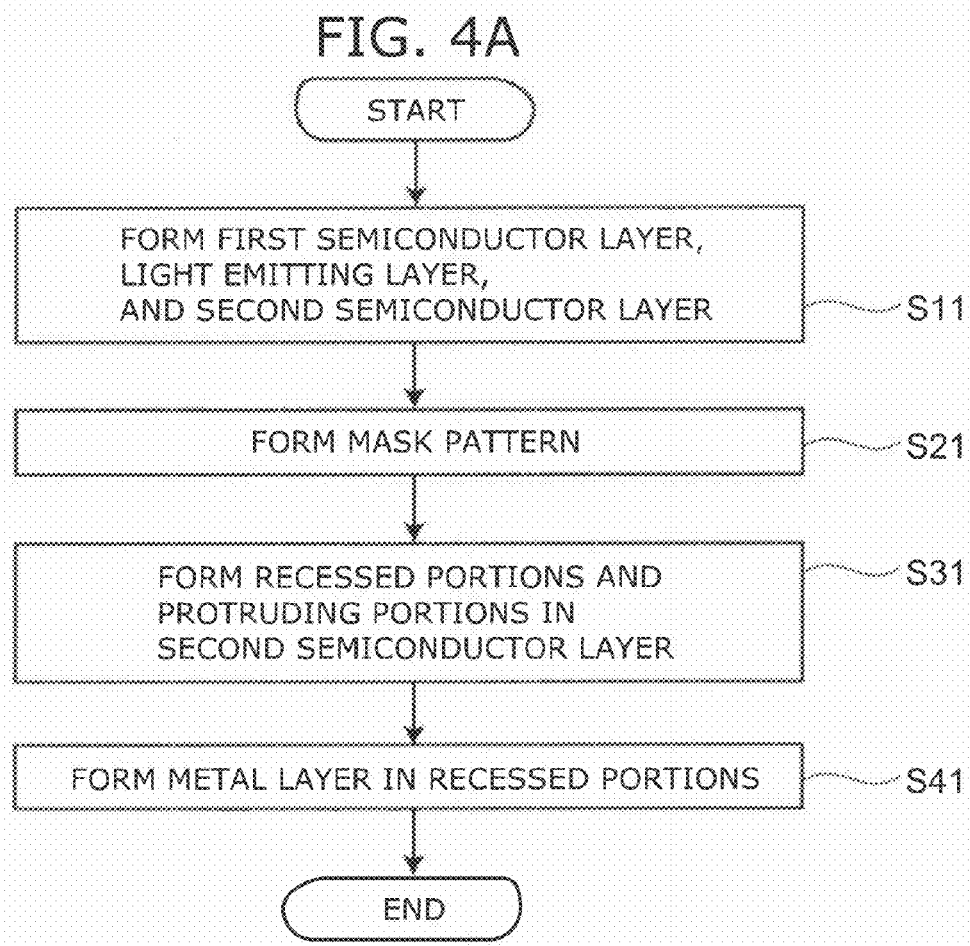

FIG. 4B is a flowchart illustrating the method for manufacturing the semiconductor light emitting device 120.

This manufacturing method includes a process of forming the first semiconductor layer 51, forming the light emitting layer 53 on the first semiconductor layer 51, and forming the second semiconductor layer 52 on the light emitting layer 53 (step S11); a process of forming a mask material on the second semiconductor layer 52 and forming a mask pattern in which multiple pillars are provided in the mask material (step S21); a process of making the recessed portions 522 in the second semiconductor layer 52 by etching the second semiconductor layer 52 using the mask pattern as a mask, and forming the protruding portions 521 to protrude from the recessed portions 522 along the Z direction, where the equivalent circular diameter of the configuration of the protruding portions 521 as viewed from the Z direction is not less than 10 nanometers and not more than 5 micrometers (step S31); and a process of filling a metal layer into the recessed portions 522 (step S41).

According to this manufacturing method, because the first electrode layer 20 is formed after the uneven portion is formed in the second semiconductor layer 52, the annealing to obtain the ohmic contact between the metal layer and the second semiconductor layer 52 can be performed in the state in which the metal layer is not formed on the protruding portions 521.

According to the above-discussed manufacturing methods as well, the light absorption layer is not provided in the portion where the metal layer of the second semiconductor layer 52 is not provided; and a semiconductor light emitting device having higher extraction and emission efficiency of the light emitted from the light emitting layer 53 to the outside can be manufactured.

The methods for manufacturing recited above may include a process of forming the second electrode layer 30 electrically connected to the first semiconductor layer 51. The second electrode layer 30 may be provided on the back face side of the structural body 100 and may be provided on the front face side of the structural body 100.

Although the process of making the recessed portions 522 is performed continuously from the processing that makes the multiple opening portions 21 of the first electrode layer 20 in the method for manufacturing the semiconductor light emitting device 110, this process may be performed as a process separate from the making of the opening portions 21 and the recessed portions 522.

The following methods (A) to (C) will now be illustrated as examples of processes to form the mask pattern recited above.

(A) Method Utilizing Fine Particle Mask

One method for manufacturing the mask pattern utilizes, for example, a single particle layer of the fine particles of silica and the like as a mask. Such a method includes the following processes.

Namely, this manufacturing method includes forming an organic composition layer on the mask material, forming a pattern of a single particle layer of fine particles in the organic composition layer, and making multiple openings by transferring the pattern of the single particle layer onto the mask material.

Figure 5:
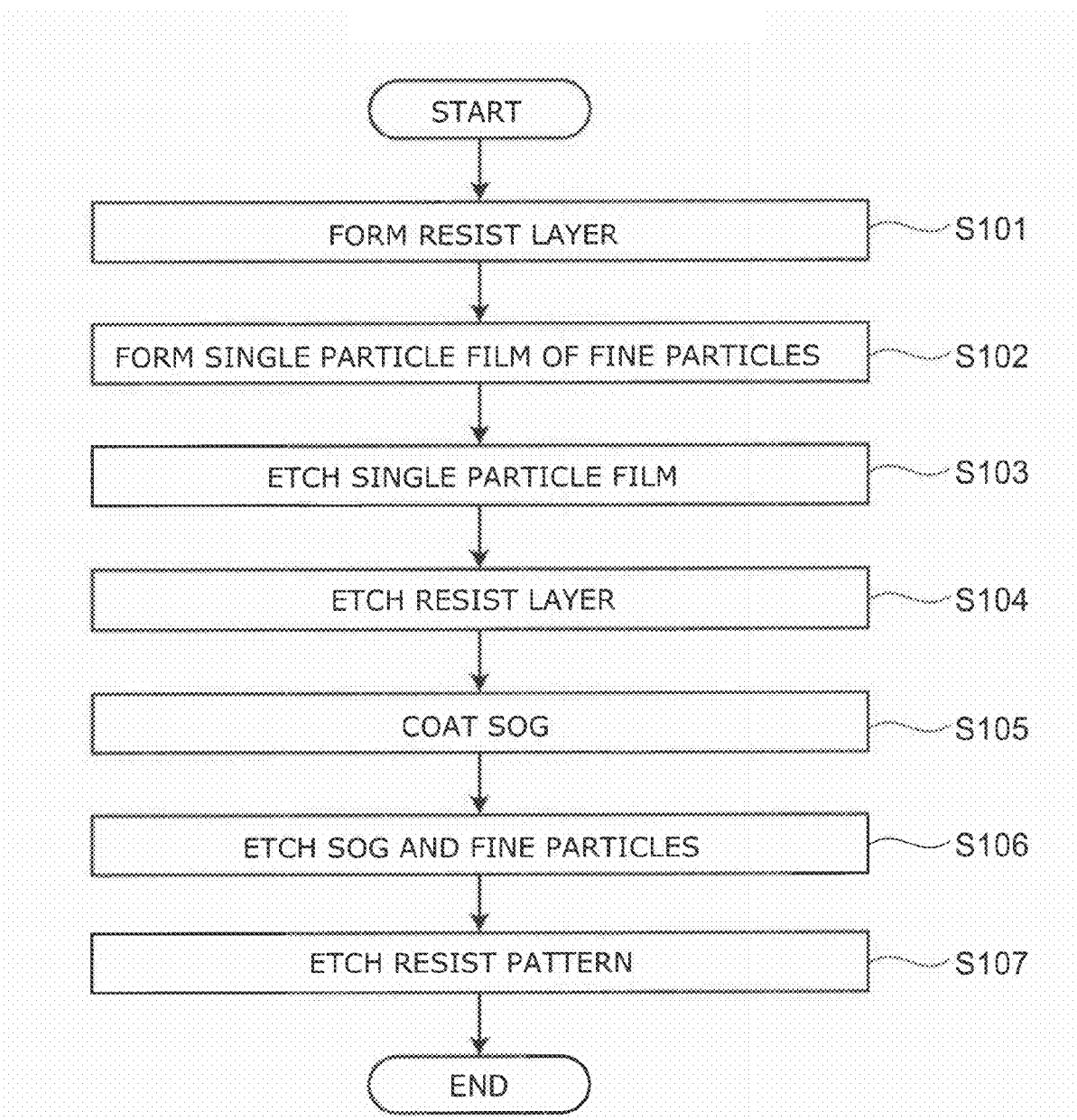
FIG. 5 is a flowchart illustrating a method for manufacturing a mask pattern.

FIG. 5 is a flowchart illustrating the method for manufacturing the mask pattern utilizing the fine particle mask.

In one specific example of this manufacturing method, first, a resist composition is coated onto the metal layer; and a thermosetting reaction is performed by heating. Thereby, a resist layer is formed (step S101). Then, RIE (Reactive Ion Etching) processing of the surface of the resist layer is performed. This processing hydrophilizes the surface of the resist layer and can increase the wettability during the subsequent dispersion solution coating. The hydrophilized layer of the surface functions as a trap layer to capture the silica particles in the subsequent process. Such a trap layer also may be formed by coating an organic polymer onto the surface of the resist layer, etc.

Then, a dispersion solution including silica fine particles having, for example, a particle size of 200 nm is coated onto the resist layer to form a dispersion solution layer. By heating, the particles of the lowermost layer of the silica fine particles sink into the hydrophilized resist layer. Subsequently, the resist layer is re-cured by cooling at room temperature; and the lowermost fine particle layer is captured by the substrate surface (step S102). Herein, although a silica fine particle is used as the fine particle, any inorganic or organic fine particle can be used as long as an etching rate difference such as that described below can be provided. Although the size of the fine particle may be selected according to the configuration of the target metal electrode layer, generally, a fine particle of 100 nm to 5 µm is selected.

Then, etching of the silica fine particle single particle film is performed (step S103). In this process, a gap forms between the adjacent particles because the silica fine particles are etched and the radii of the particles are reduced. The conditions of this etching are selected such that the resist layer of the foundation is substantially not etched. The gap between the particles can be made by etching the silica fine particles with an etching rate difference.

Then, the resist layer of the foundation is etched utilizing the remaining silica fine particles as an etching mask (step S104). Thereby, a resist pattern having a columnar configuration having a high aspect ratio is obtained at the portions where the silica fine particles initially existed.

Continuing, a solution of SOG (spin on glass) is coated onto the columnar resist pattern and heated (step S105). Thereby, the resist pattern is buried in the SOG.

Then, the SOG and the silica fine particles on the columnar resist pattern are removed by etching to form a structure of the columnar resist pattern and the SOG filled into the gaps therebetween (step S106).

Then, the remaining resist pattern having the columnar configuration is etched (step S107). In this process, a mask pattern of the SOG is formed with a structure inverted from the columnar resist pattern.

(B) Method Using the Self-Assembly of Block Copolymer

Another method for manufacturing the mask pattern utilizes phase separation due to the self-assembly block copolymer. Such a method includes the following processes.

Namely, this manufacturing method includes forming a block copolymer film on the mask material using a composition including a block copolymer and forming a micro phase separation pattern by performing phase separation of the block copolymer film. The micro phase separation pattern becomes the mask pattern recited above.

Figure 6:
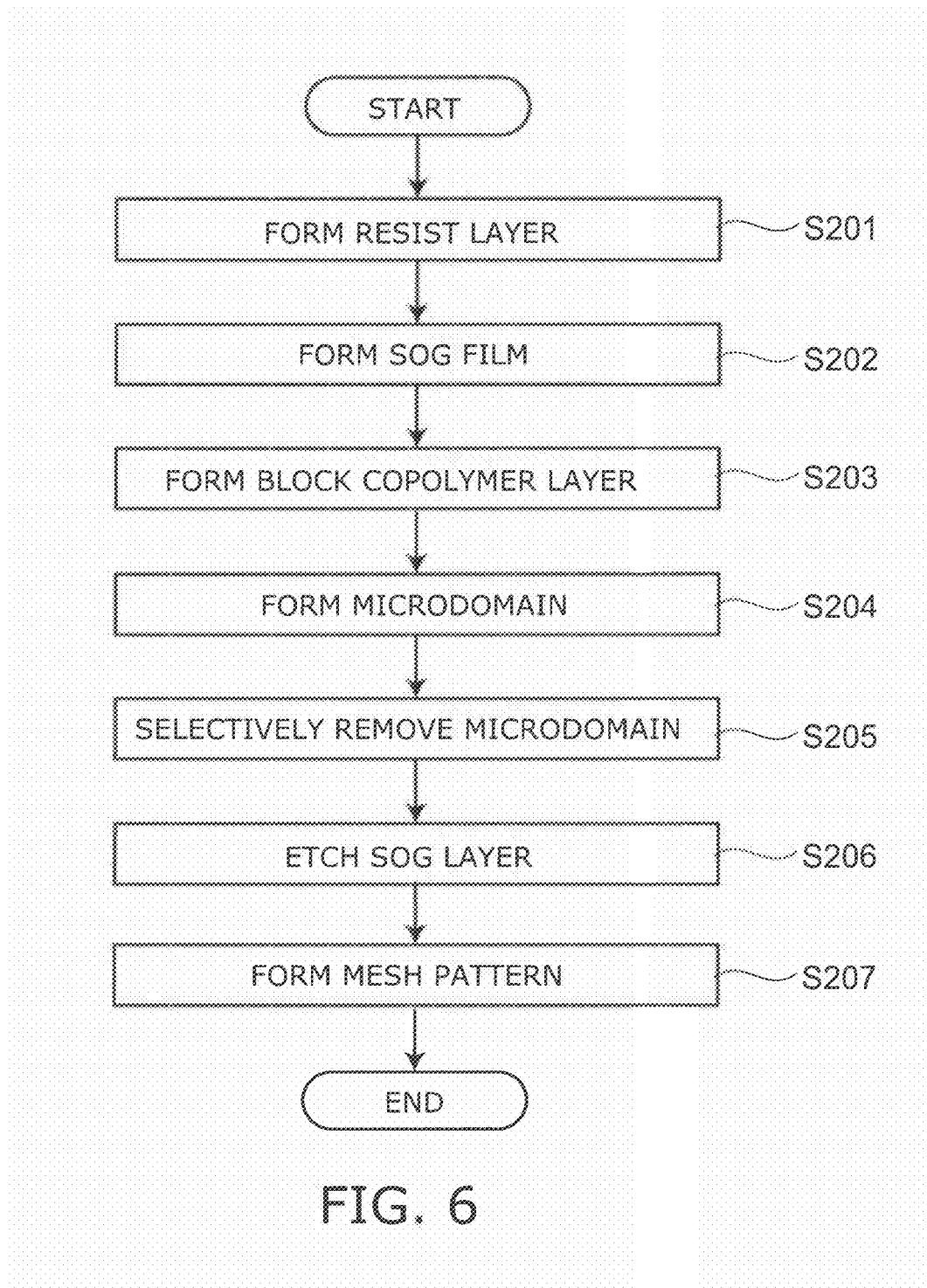
FIG. 6 is a flowchart illustrating a method for manufacturing a mask pattern.

FIG. 6 is a flowchart illustrating the method for manufacturing the mask pattern using the self-assembly block copolymer.

In one specific example of this manufacturing method, first, a resist composition is coated onto the metal layer; and a thermosetting reaction is performed by heating. Thereby, a resist layer is formed (step S201). Other than the resist, a carbon film can be used. Then, a SOG layer is formed by coating a SOG solution onto the resist layer and by subsequent heating (step S202). Other than the SOG, $SiO_2$ and/or SiN can be used.

Then, a solution of a resin composition including a diblock copolymer of polystyrene (PS)-polymethylmethacrylate (PMMA) is prepared. This solution is coated onto the SOG layer to form a block copolymer layer (step S203). Further heating is performed to cause phase separation of the diblock copolymer to obtain a morphology in which a microdomain having a dot configuration of the PMMA in a matrix of the PS is formed (step S204). For a block copolymer other than the PS-PMMA, it is favorable to use a combination of an aromatic ring polymer and an acrylic polymer. This is because there is a difference of the dry etching rate between the two types of polymers when an appropriate gas type is used.

Aromatic ring polymers may include, for example, PS, poly(vinyl naphthalene), poly(hydroxystyrene), and derivatives thereof. Acrylic polymers may include, for example, poly(cyclohexyl methacrylate), poly(phenyl methacrylate), and alkyl methacrylates such as poly(methyl methacrylate), poly(butyl methacrylate), poly(hexyl methacrylate), etc., and derivatives thereof. Similar properties are provided when using acrylates instead of such methacrylates. Of these, it is favorable to use the block copolymer of PS-PMMA. Namely, synthesis is easy using the block copolymer of PS-PMMA. The control of the molecular weights of the polymers is easy for the block copolymer of PS-PMMA.

Then, the microdomain having the dot configuration of the PMMA of the block copolymer is removed selectively by etching the diblock copolymer layer (step S205). At this time, conditions are selected such that the matrix portion of the PS is not etched. The SOG layer is exposed at the dot portions of the PMMA.

Continuing, the SOG layer is etched using the remaining PS as a mask (step S206). By this etching, the exposed SOG layer is etched selectively; the matrix of the PS is transferred onto the SOG layer; and a mesh pattern of the SOG according to the phase separation of the block copolymer is formed.

Then, a mesh pattern of the SOG/resist is formed by etching the resist layer of the foundation using the SOG mesh pattern as a mask (step S207).

Although an example of a method is illustrated herein in which a mask having a mesh configuration is formed by transferring the phase separation pattern of the block copolymer onto the SOG layer and the resist layer used as an intermediate mask layer, a method is possible in which the pattern of the block copolymer is used as a mask to directly transfer onto the metal layer. Further, a combination of other materials may be used as the intermediate mask layer. However, from the viewpoint of the etching selectivity, it is more favorable to provide a higher selectivity by providing an intermediate mask than to pattern the metal electrode layer directly using the block copolymer as a mask.

(C) Method of Utilizing Stamper

Yet another method for manufacturing the mask pattern utilizes a stamper. Such a method includes the following processes.

Namely, in this manufacturing method, multiple openings are made by pressing an unevenness pattern of the stamper onto the mask material to transfer the unevenness pattern onto the mask material.

Figure 7:
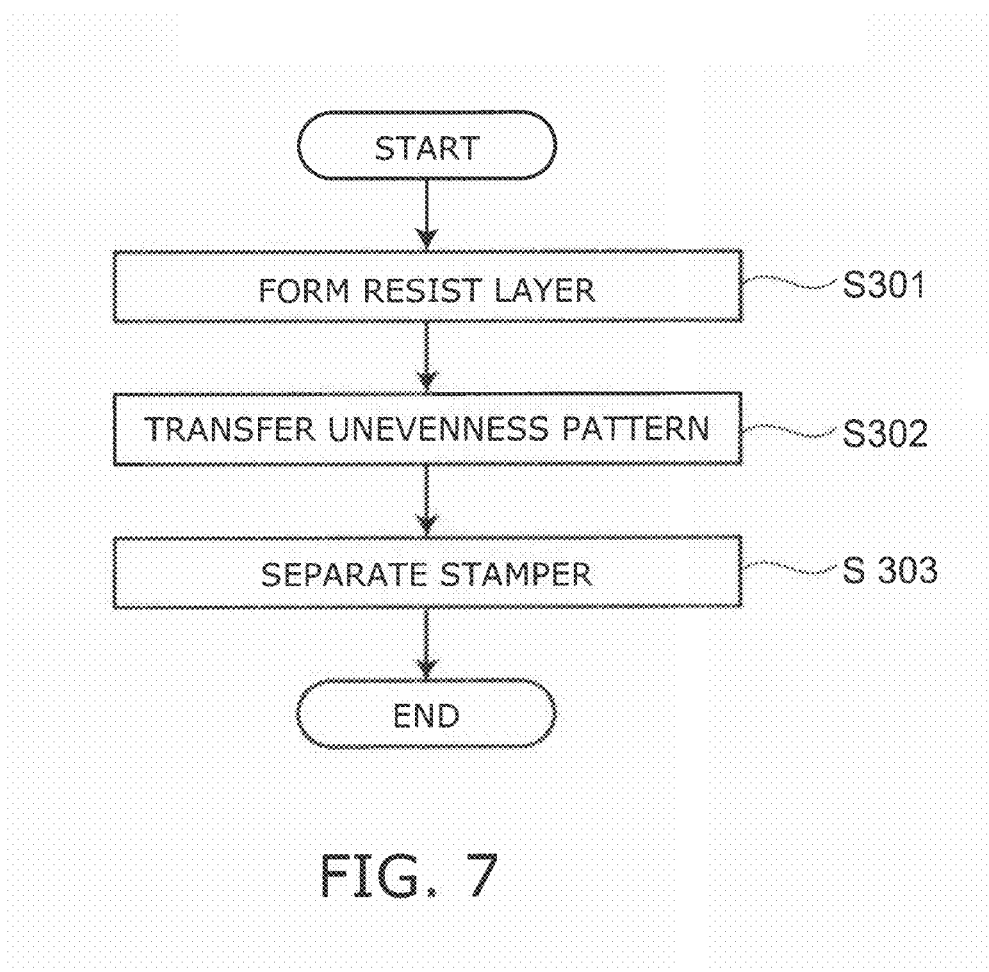
FIG. 7 is a flowchart illustrating a method for manufacturing a mask pattern.

FIG. 7 is a flowchart illustrating the method for manufacturing the mask pattern utilizing the stamper.

In one specific example of this manufacturing method, first, a resist composition is coated onto the metal layer; and a thermosetting reaction is performed by heating. Thereby, a resist layer is formed (step S301).

Then, an unevenness pattern corresponding to the opening configuration of the multiple opening portions 21 is transferred onto the resist layer using the stamper which is a mold (step S302).

The stamper can be manufactured by forming the desired structure on, for example, quartz using electron beam lithography. The material of the stamper and the formation method of the unevenness pattern of the stamper are not limited thereto. For example, it is possible also to form the stamper by the method using the fine particles or the method using the block copolymer described above.

Then, the unevenness pattern of the stamper is pressed onto the resist layer while heating if necessary and is separated after the heat dissipates (step S303). Thereby, a reversed pattern of the unevenness pattern of the stamper is transferred onto the resist layer. Thereby, the mask pattern of the resist including the multiple openings is formed.

Each of the manufacturing methods of (A) to (C) recited above is an example; and the methods are not limited thereto.

Examples will now be described. The materials, numbers, manufacturing conditions, etc., illustrated in the examples recited below are examples; and the invention is not limited thereto.

First Example

FIGS. 8A to 8I are schematic cross-sectional views illustrating a method for manufacturing a semiconductor light emitting device according to a first example.

In the first example, a semiconductor light emitting device 110-1 according to the first embodiment was formed by utilizing the fine particle mask of (A) recited above. The light emission wavelength of the semiconductor light emitting device 110-1 is 630 nm.

Figure 8A:
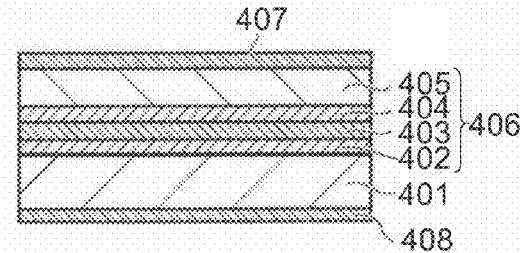
FIGS. 8A to 8I, 9A to 9F, 10A to 10F, 11A to 11H, 12A to 12H, 13A to 13G, and 14A to 14F are schematic cross-sectional views illustrating methods for manufacturing a semiconductor light emitting device.

First, as illustrated in FIG. 8A, an n-type InGaAlP layer 402, which is the clad layer 51b, is formed on an n-type GaAs substrate 401, which is the substrate 51a; and an InGaAlP layer 403, which is the light emitting layer 53, is formed thereon. Then, a p-type InGaAlP layer 404, which is the clad layer 52a, and a p-type GaP layer 405, which is the current diffusion layer 52b, are formed sequentially on the InGaAlP layer 403 to form a semiconductor multilayered film 406.

Then, a metal multilayered film 407 used to form the first electrode layer 20 is formed on the p-type GaP layer 405 using vacuum vapor deposition. The metal multilayered film 407 includes a Au film having a thickness of 10 nm and a Au—Zn alloy film having a thickness of 30 nm. The Au film is formed on the semiconductor multilayered film 406; and the Au—Zn alloy film is formed on the Au film.

An electrode layer 408 used to form the second electrode layer 30 is formed on the back face of the n-type GaAs substrate 401 using vacuum vapor deposition. The electrode layer 408 includes a Au—Ge alloy having a thickness of 150 nm.

Subsequently, sintering is performed using the conditions of 450° C. for 30 minutes in a nitrogen atmosphere. Thereby, ohmic contacts are formed between the n-type GaAs substrate 401 and the electrode layer 408 and between the p-type GaP layer 405 (the current diffusion layer) and the metal multilayered film 407.

Continuing, a solution of a positive thermosetting i-ray resist is coated onto the metal multilayered film 407. The solution is a positive thermosetting i-ray resist (THMR IP3250 (product name) made by Tokyo Ohka Kogyo Co., Ltd.) diluted 1:1 in ethyl lactate. The solution is spin-coated at 2000 rpm (rotations per minute).

Figure 8B:
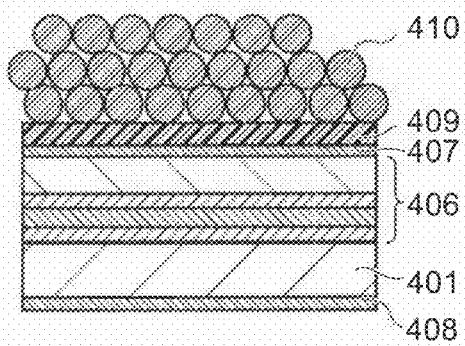

Subsequently, the solution is heated on a hotplate. The heating conditions are 110° C. for 90 seconds. Then, heating is performed in a nitrogen atmosphere in a non-oxidizing oven. The heating conditions are 270° C. for 1 hour. Thereby, a thermosetting reaction was performed on the solution of the resist. As illustrated in FIG. 8B, the film thickness of an obtained resist layer 409 was about 240 nm.

Then, hydrophilizing treatment of the surface of the resist layer 409 was performed using an RIE apparatus. The processing conditions of the RIE are a flow rate of $O_2$ of 30 sccm, a pressure of 13.3 Pa, and an RF power of 100 W.

Continuing, a silica fine particle dispersion solution for coating is obtained by diluting a dispersion solution including silica fine particles having a particle size of 400 nm to be 5 weight percent (wt %) in a composition including an acrylic polymer and by performing filtering using a filter having a 1 μm mesh.

Figure 8C:
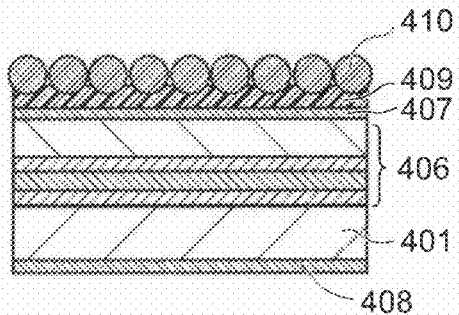

After spin coating the silica fine particle dispersion solution onto the resist layer 409, heating is performed in a nitrogen atmosphere in a non-oxidizing oven. The heating conditions are 150° C. for 1 hour. Subsequently, as illustrated in FIG. 8C, cooling at room temperature is performed to obtain a regular arrangement single particle layer of silica fine particles 410 on the hydrophilized resist layer 409.

Figure 8D:
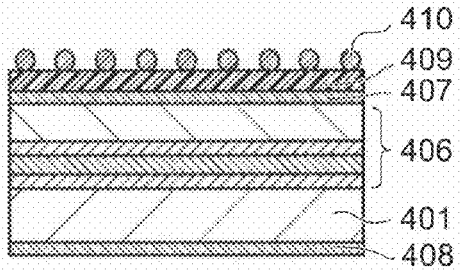

Then, as illustrated in FIG. 8D, RIE processing was performed on the regular arrangement single particle layer of the silica fine particles. The processing conditions of the RIE are a flow rate of $CF_4$ of 30 sccm, a pressure of 1.3 Pa, and an RF power of 100 W. The silica particles are shrunk (contracted) by the RIE processing. After this process, observation using an electron microscope showed that the particle size of the silica fine particles 410 was about 120 nm and the gap between the particles was about 280 nm.

Figure 8E:
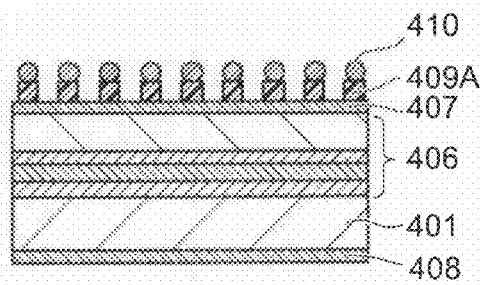

Continuing as illustrated in FIG. 8E, RIE processing is performed on the resist layer 409 of the foundation using the silica fine particles 410 as an etching mask. The processing conditions of the RIE are a flow rate of $O_2$ of 30 sccm, a pressure of 0.3 Pa, and an RF power of 100 W. Thereby, a resist pattern 409A having a columnar configuration having a high aspect ratio was obtained.

Figure 8F:
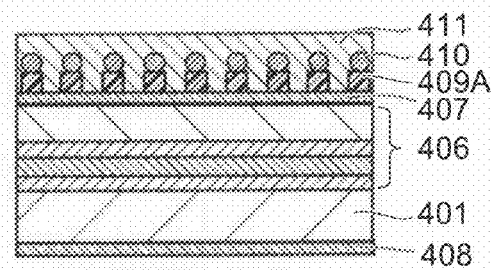

Then, as illustrated in FIG. 8F, SOG (OCD-12000T (product name) made by Tokyo Ohka Kogyo Co., Ltd.) was filtered using a filter having a 0.2 μm mesh and then spin-coated. Thereby, a SOG layer 411 is filled around the resist pattern 409A and the silica fine particles 410.

Subsequently, the SOG layer 411 is heated on a hotplate. The heating conditions are 110° C. for 90 seconds. Then, heating is performed in a nitrogen atmosphere in a non-oxidizing oven. The heating conditions are 250° C. for 1 hour.

Figure 8G:
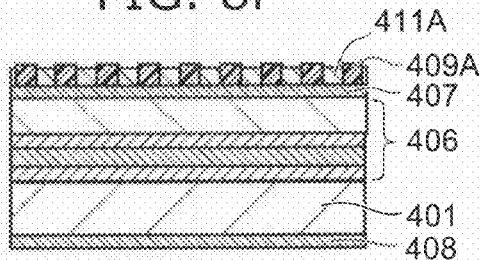

Then, RIE processing is performed on the SOG layer 411 formed by this process and the silica fine particles 410 covered with the SOG layer 411. The processing conditions of the RIE are $CF_4$ of 30 sccm, a pressure of 1.3 Pa, and an RF power of 100 W. The SOG layer 411 and the silica fine particles 410 on the resist pattern 409A having the columnar configuration are removed by this processing. Thereby, as illustrated in FIG. 8G, a structure is formed to include the resist pattern 409A having the columnar configuration and a SOG mask 411A filled into the gap therebetween.

Figure 8H:
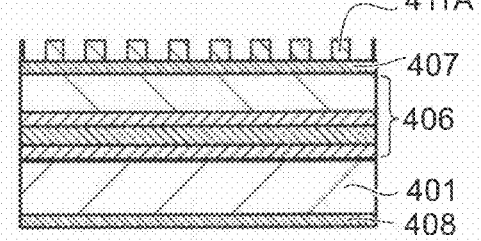

Continuing, RIE processing is performed on the remaining resist pattern 409A having the columnar configuration. The processing conditions of the RIE are a flow rate of $O_2$ of 30 sccm, a pressure of 0.3 Pa, and an RF power of 100 W. By this process, as illustrated in FIG. 8H, the SOG mask 411A having a structure inverted from that of the resist pattern 409A having the columnar configuration is formed on the metal multilayered film 407.

Figure 8I:
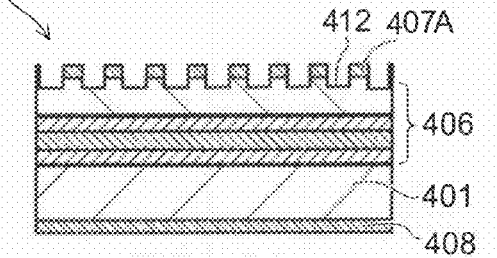

Then, opening portions are made in the metal multilayered film 407 by performing ion milling (with an acceleration voltage of 500 V, an ion current of 40 mA, and an incident angle of 0°) using the SOG mask 411A as a mask. As illustrated in FIG. 8I, an electrode layer 407A is completed by making the opening portions in the metal multilayered film 407. By continuing the ion milling, the recessed portions 412 are made in the p-type GaP layer 405 (the current diffusion layer 52b).

At this time, the average distance between the adjacent recessed portions 412 made in the metal multilayered film 407 was 400 nm. The depth of the recessed portions 412 made in the p-type GaP layer 405 (the current diffusion layer 52b) was 100 nm.

Then, the remaining SOG mask 409A is removed by processing using dilute hydrofluoric acid (5 wt %); and a round pad electrode (not illustrated) made of Au is formed on a portion of the electrode layer 407A. Thereby, the semiconductor light emitting device 110-1 according to the first example is completed.

As a comparative example 1-1, a semiconductor light emitting device is manufactured in which the semiconductor light emitting device is similar to that of the first example except that the electrode layer 407A including the opening portions and the recessed portions 412 of the p-type GaP layer 405 (the current diffusion layer 52b) are not provided and only the round pad electrode is provided.

As a comparative example 1-2, a semiconductor light emitting device is manufactured in which the semiconductor light emitting device is similar to that of the first example except that the recessed portions 412 are not made in the p-type GaP layer 405 (the current diffusion layer 52b).

The semiconductor light emitting device 110-1 according to the first example and the semiconductor light emitting devices according to the comparative examples 1-1 and 1-2 were diced into 1 mm×1 mm chips; and luminance measurements were performed in the bare chip state using a chip tester.

The semiconductor light emitting devices were compared using the maximum luminance. In the case that the maximum luminance of the semiconductor light emitting device according to the comparative example 1-1 was taken to be unity, the maximum luminance of the semiconductor light emitting device according to the comparative example 1-2 was 1.2 and the maximum luminance of the semiconductor light emitting device 110-1 according to the first example was 1.4. When comparing the forward voltage for 100 mA, the forward voltage for each of the semiconductor light emitting device according to the comparative example 1-2 and the semiconductor light emitting device 110-1 according to the first example was 0.3 V lower than that of the semiconductor light emitting device according to the comparative example 1-1.

Second Example

FIGS. 9A to 9F are schematic cross-sectional views illustrating a method for manufacturing a semiconductor light emitting device according to a second example.

In the second example, a semiconductor light emitting device 110-2 according to the first embodiment is formed using the method using the self-assembly block copolymer of (B) recited above. The light emission wavelength of the semiconductor light emitting device 110-2 is 630 nm.

Figure 9A:
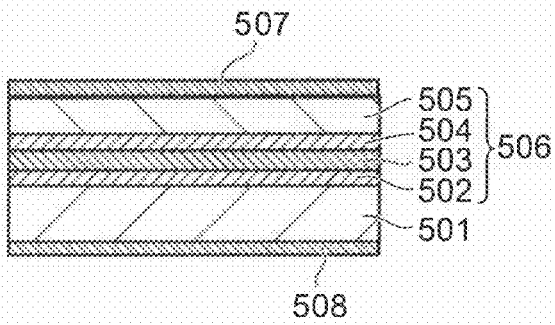

First, similarly to the first example, and as illustrated in FIG. 9A, a semiconductor multilayered film 506 is formed by sequentially forming an n-type GaAs substrate 501, an n-type InGaAlP layer 502, an InGaAlP layer 503, a p-type InGaAlP layer 504, and a p-type GaP layer 505. Then, similarly to the first example, a metal multilayered film 507 is formed on the semiconductor multilayered film 506; and an electrode layer 508 is formed on the back face of the n-type GaAs substrate 501.

Subsequently, sintering is performed using the conditions of 450° C. for 30 minutes in a nitrogen atmosphere. Thereby, ohmic contacts are formed between the n-type GaAs substrate 501 and the electrode layer 508 and between the p-type GaP layer 505 and the metal multilayered film 507.

Then, a solution of a positive thermosetting i-ray resist is coated onto the metal multilayered film 507. The solution is a positive thermosetting i-ray resist (THMR IP3250 (product name) made by Tokyo Ohka Kogyo Co., Ltd.) diluted 1:1 in ethyl lactate. The solution is spin-coated at 3000 rpm.

Figure 9D:
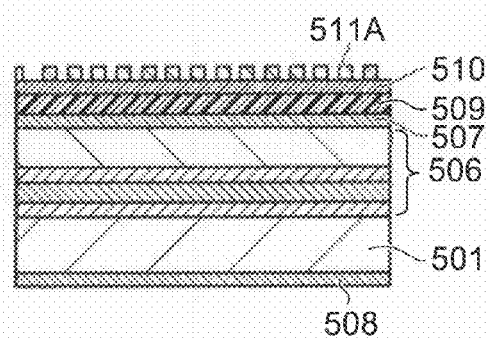
Figure 9B:
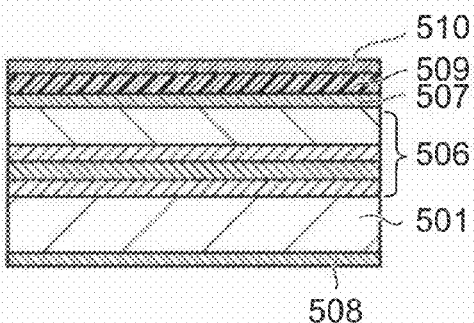

Subsequently, the solution is heated on a hotplate. The heating conditions are 110° C. for 90 seconds. Subsequently, heating is performed in a nitrogen atmosphere in a non-oxidizing oven. The heating conditions are 250° C. for 1 hour. Thereby, a thermosetting reaction was performed on the solution of the resist. As illustrated in FIG. 9B, the film thickness of an obtained resist layer 509 was about 170 nm.

Then, a solution of a SOG solution (OCD-5500T (product name) made by Tokyo Ohka Kogyo Co., Ltd.) diluted 1:3 in ethyl lactate is coated onto the resist layer 509. The solution is spin-coated at 3000 rpm. Subsequently, the solution is heated on a hotplate. The heating conditions are 110° C. for 90 seconds. Subsequently, heating is performed in a nitrogen atmosphere in a non-oxidizing oven. The heating conditions are 250° C. for 1 hour. By this heating, a SOG layer 510 is formed with a thickness of 30 nm.

Continuing, a diblock copolymer of PS-PMMA (P6000 (product name) having a PS molecular weight of 260,000 and a PMMA molecular weight of 65,300 made by Polymer Source, Inc.) is prepared to be 2 wt % in a solvent of propylene glycol monomethyl ether acetate (PGMEA). A homopolymer of PS (with a molecular weight of 2000) is prepared to be 2 wt % in a solvent of PGMEA.

Then, a solution of a resin composition containing a block copolymer is prepared by mixing the block copolymer solution and the PS homopolymer solution with a weight ratio of 8:2.

Figure 9E:
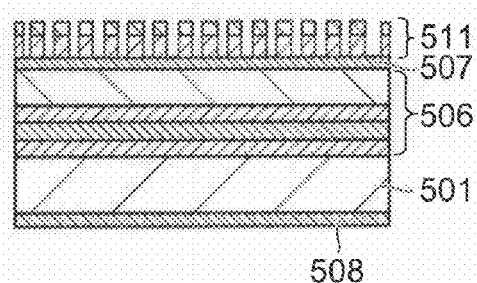
Figure 9C:
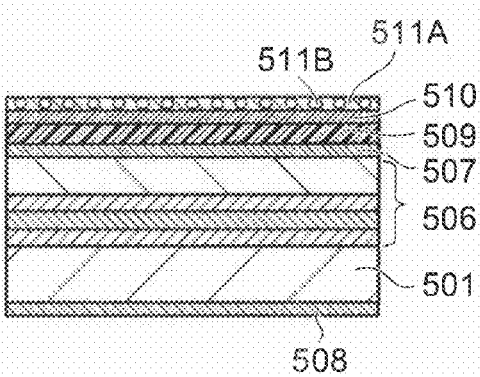

Continuing, the solution is coated onto the SOG layer 510 at 2500 rpm to form a block copolymer layer. Then, heating is performed on a hotplate. The heating conditions are 110° C. for 90 seconds. Then, heating is performed in a nitrogen atmosphere in a non-oxidizing oven. The heating conditions are 180° C. for 8 hours. Thereby, as illustrated in FIG. 9C, phase separation of the diblock copolymer is performed to obtain a morphology in which a microdomain 511B having a dot configuration of PMMA in a matrix 511A of PS is formed.

Then, RIE processing is performed on the diblock copolymer layer. The processing conditions of the RIE are a flow rate of $O_2$ of 5 sccm, a flow rate of Ar of 25 sccm, a pressure of 13.3 Pa, and an RF power of 100 W. Thereby, as illustrated in FIG. 9D, the microdomain 511B having a dot configuration of PMMA of the block copolymer is selectively removed.

Then, RIE processing was performed on the SOG layer 510 using the remaining PS as a mask. The RIE used a gas mixture of $CF_4$ and $CHF_3$. The processing conditions of the RIE are a flow rate of $CF_4$ of 10 sccm, a flow rate of $CHF_3$ of 20 sccm, a pressure of 0.7 Pa, and an RF power of 100 W. Thereby, a mesh pattern of the SOG is formed.

Further, RIE processing is performed on the resist layer 509 of the foundation. The processing conditions of the RIE are a flow rate of $O_2$ of 30 sccm, a pressure of 0.3 Pa, and an RF power of 100 W. By this etching, as illustrated in FIG. 9E, a mesh pattern 511 of the SOG/resist is formed.

Figure 9F:
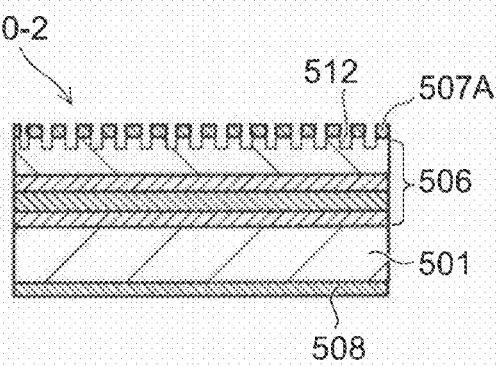

Then, similarly to the first example, milling is performed on the metal multilayered film 507 of the lower layer using the mesh pattern 511 of the SOG/resist as a mask to make opening portions in the metal multilayered film 507. As illustrated in FIG. 9F, an electrode layer 507A is completed by making the opening portions in the metal multilayered film 507. Recessed portions 512 are made in the p-type GaP layer 505 by continuing the milling.

At this time, the average distance between the adjacent opening portions made in the metal multilayered film 507 was 100 nm. The depth of the recessed portions 512 made in the p-type GaP layer 505 was 100 nm.

Then, the remaining SOG layer 510 is removed using dilute hydrofluoric acid (5 wt %); and ashing is performed to remove the resist layer 509.

Continuing, a round pad electrode (not illustrated) made of Au is formed on a portion of the electrode layer 507A. Thereby, the semiconductor light emitting device 110-2 according to the second example is completed.

As a comparative example 2-1, a semiconductor light emitting device is manufactured in which the semiconductor light emitting device is similar to that of the second example except that the electrode layer 507A including the opening portions and the recessed portions 512 of the p-type GaP layer 505 are not provided and only the round pad electrode is provided.

The semiconductor light emitting device 110-2 according to the second example and the semiconductor light emitting devices according to the comparative examples 1-1 and 2-1 were diced into 1 mm×1 mm chips; and luminance measurements were performed in the bare chip state using a chip tester.

The semiconductor light emitting devices were compared using the maximum luminance. In the case where the maximum luminance of the semiconductor light emitting device according to the comparative example 1-1 was taken to be unity, the maximum luminance of the semiconductor light emitting device according to the comparative example 2-1 was 1.2 and the maximum luminance of the semiconductor light emitting device 110-2 according to the second example was 1.6.

In the semiconductor light emitting device 110-2 according to the second example, the distance between the opening portions of the electrode layer is narrower than that of that of the first example. Therefore, in the semiconductor light emitting device 110-2 according to the second example, the extraction efficiency of the light was higher than that of the semiconductor light emitting device 110-1 according to the first example due to the low-order diffraction effects. Thereby, the luminance increased.

Third Example

FIGS. 10A to 10F are schematic cross-sectional views illustrating a method for manufacturing a semiconductor light emitting device according to a third example.

In the third example, a semiconductor light emitting device 110-3 according to the first embodiment is manufactured using the method utilizing the stamper of (C) recited above. The light emission wavelength of the semiconductor light emitting device 110-3 is 630 nm.

Figure 10A:
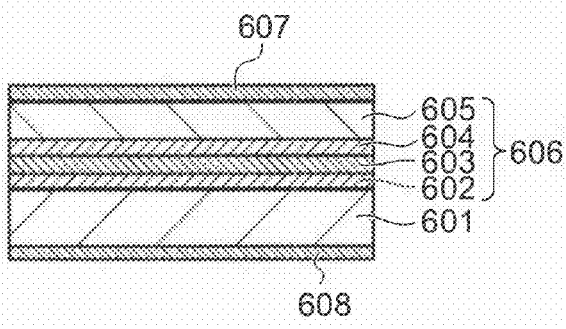

First, as illustrated in FIG. 10A, similarly to the first example, a semiconductor multilayered film 606 is formed by sequentially forming an n-type InGaAlP layer 602, an InGaAlP layer 603, a p-type InGaAlP layer 604, and a p-type GaP layer 605 on an n-type GaAs substrate 601. Then, similarly to the first example, a metal multilayered film 607 and an electrode layer 608 are formed.

Figure 10D:
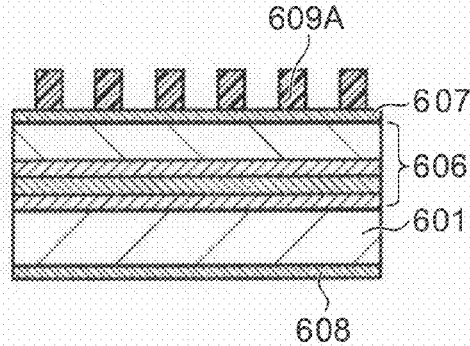
Figure 10B:
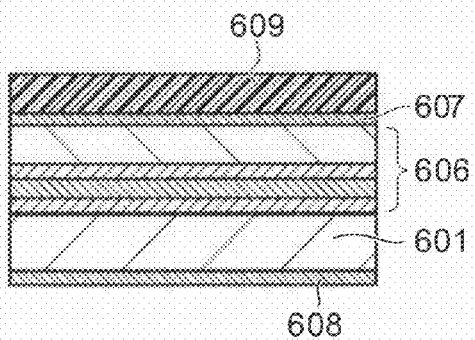

Then, a solution of a positive thermosetting i-ray resist is coated onto the metal multilayered film 607. The solution is a positive thermosetting i-ray resist (THMR IP3250 (product name) made by Tokyo Ohka Kogyo Co., Ltd.) diluted 1:1 in ethyl lactate. The solution is spin-coated at 3000 rpm. Subsequently, the solution is heated on a hotplate. The heating conditions are 110° C. for 90 seconds. Thereby, a thermosetting reaction was performed on the solution of the resist. As illustrated in FIG. 10B, the film thickness of an obtained resist layer 609 was about 170 nm.

Figure 10E:
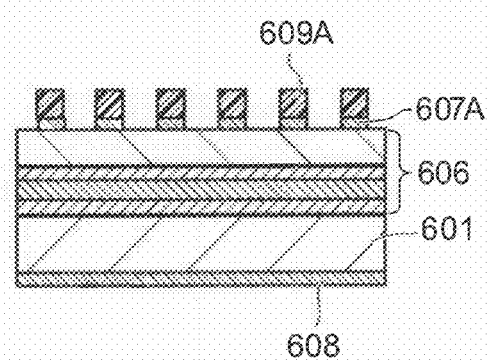
Figure 10C:
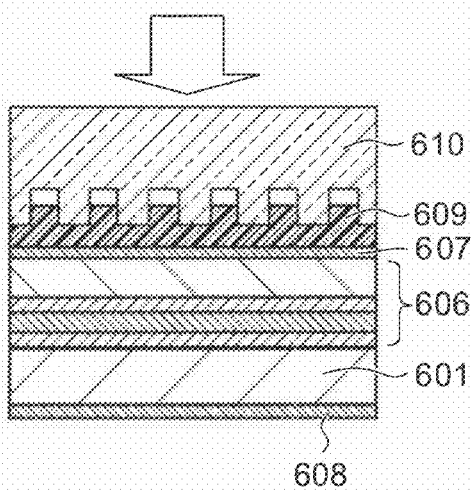

Then, as illustrated in FIG. 10C, a quartz stamper 610, which is a mold, is prepared. The unevenness pattern of the stamper 610 is patterned using electron beam lithography. Pillars having a height of 120 nm and a diameter of 60 nm are arranged in the densest fillable arrangement with a period of 100 nm in the unevenness pattern. At this time, the surface of the stamper 610 is coated with a fluorine-based release agent such as perfluoropolyether to reduce the surface energy of the stamper 610. The coating increases the ability to separate the stamper 610.

Continuing as illustrated in FIG. 10C, the unevenness pattern of the stamper 610 is pressed onto the resist layer 609. The stamper 610 is pressed onto the resist layer 609 using a heater plate press (model N4005-00 (product name) made by NPA). The press conditions are a heating temperature of 128° C., a pressure of 60 kN, and a pressurizing time of 1 hour. Subsequently, the stamper 610 is returned to room temperature and separated vertically. Thereby, an inverted pattern of the unevenness pattern of the stamper 610 is formed in the resist layer 609. As illustrated in FIG. 10D, the inverted pattern becomes a resist pattern 609A in which periodic openings are arranged.

Figure 10F:
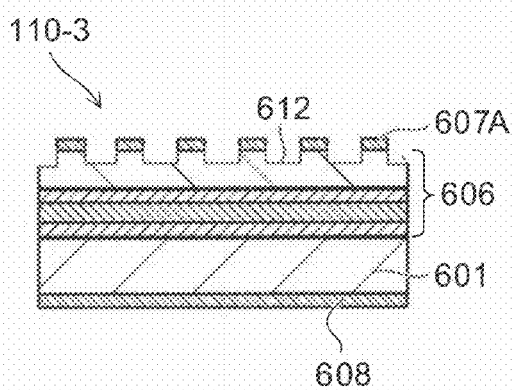

Then, as illustrated in FIG. 10E, milling was performed on the metal multilayered film 607 and the p-type GaP layer 605 similarly to the first example using the resist pattern 609A as an etching mask. An electrode layer 607A is completed by making opening portions in the metal multilayered film 607. Then, as illustrated in FIG. 10F, the recessed portions 612 are made in the p-type GaP layer 605 by continuing the milling.

At this time, the average distance between the adjacent opening portions made in the metal multilayered film 607 was 100 nm. The depth of the recessed portions 612 made in the p-type GaP layer 605 was 300 nm.

Then, the remaining resist pattern 609A is removed using ashing. Further, a round pad electrode (not illustrated) made of Au is formed on a portion of the electrode layer 507A. Thereby, the semiconductor light emitting device 110-3 according to the third example is completed.

As a comparative example 3-1, a semiconductor light emitting device is manufactured in which the electrode layer 607A including opening portions similar to that of the third example is included but the recessed portions 612 are not made in the p-type GaP layer 605.

The semiconductor light emitting device 110-3 according to the third example and the semiconductor light emitting devices according to the comparative example 3-1 and the comparative example 1-1 were diced into 1 mm×1 mm chips; and luminance measurements were performed in the bare chip state using a chip tester.

The semiconductor light emitting devices were compared using the maximum luminance. In the case that the maximum luminance of the semiconductor light emitting device according to the comparative example 1-1 was taken to be unity, the maximum luminance of the semiconductor light emitting device according to the comparative example 3-1 was 1.2 and the maximum luminance of the semiconductor light emitting device 110-3 according to the third example was 1.7.

In the semiconductor light emitting device 110-3 according to the third example, although the distance between the opening portions of the electrode layer is about the same as that of the second example, the depth of the recessed portions 612 is deeper than the depth of the recessed portions 512 of the semiconductor light emitting device 110-2 according to the second example. Therefore, the diffraction effects were increased further and the luminance was higher.

Fourth Example

FIGS. 11A to 11H are schematic cross-sectional views illustrating a method for manufacturing a semiconductor light emitting device according to a fourth example.

In the fourth example, a semiconductor light emitting device 120-4 according to the second embodiment is formed by utilizing the fine particle mask of (A) recited above. The light emission wavelength of the semiconductor light emitting device 120-4 is 630 nm.

Figure 11A:
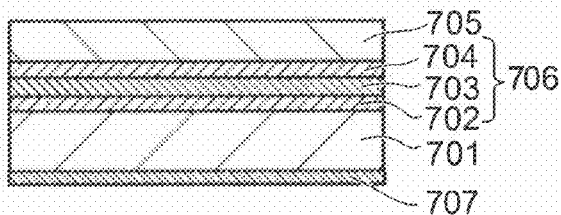

First, as illustrated in FIG. 11A, an n-type InGaAlP layer 702, which is the clad layer 51b, is formed on an n-type GaAs substrate 701, which is the substrate 51a; and an InGaAlP layer 703, which is the light emitting layer 53, is formed thereon. Then, a semiconductor multilayered film 706 is formed by sequentially forming a p-type InGaAlP layer 704, which is the clad layer 52a, and a p-type GaP layer 705, which is the current diffusion layer 52b, on the InGaAlP layer 703.

Then, an electrode layer 707 used to form the second electrode layer 30 is formed on the back face of the n-type GaAs substrate 701 using vacuum vapor deposition. The electrode layer 707 includes a Au—Ge alloy having a thickness of 150 nm.

Figure 11E:
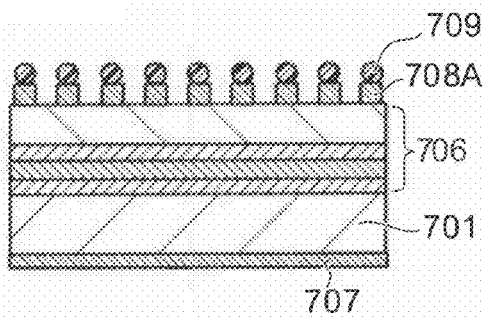
Figure 11B:
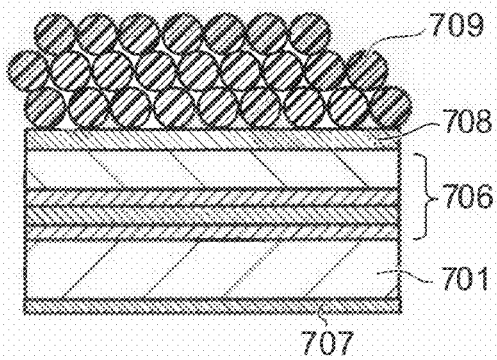

Continuing, as illustrated in FIG. 11B, a resist layer 708 is formed on the p-type GaP layer 705. The film thickness of the resist layer 708 is 240 nm. Subsequently, hydrophilizing treatment is performed on the surface of the resist layer 708 using RIE processing.

Then, a dispersion solution including silica fine particles 709 having a particle size of 400 nm similar to that of the first example is spin-coated onto the resist layer 708. Subsequently, the dispersion solution is heated in a nitrogen atmosphere in a non-oxidizing oven. The heating conditions are 150° C. for 1 hour.

Figure 11F:
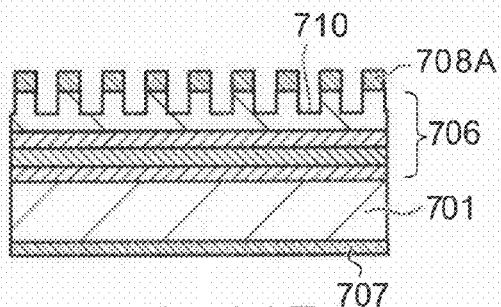
Figure 11C:
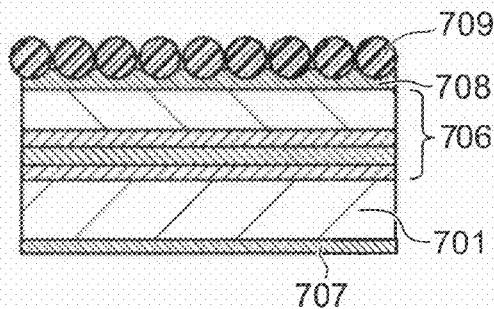

Subsequently, by cooling the dispersion solution at room temperature as illustrated in FIG. 11C, a regular arrangement single particle layer of the silica fine particles 709 is obtained on the hydrophilized resist layer 708.

Figure 11G:
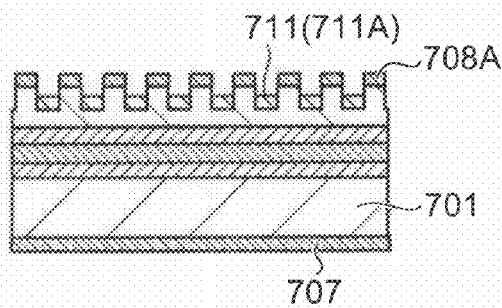
Figure 11D:
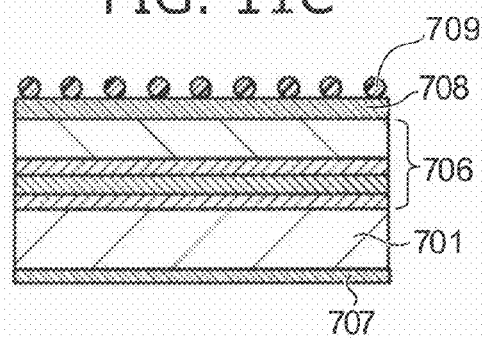

Then, as illustrated in FIG. 11D, similarly to the first example, the silica particles 709 are shrunk by performing RIE using $CF_4$ on the silica single particle film. The particle size of silica fine particles 709 is about 120 nm; and the gap between the particles is about 280 nm.

Continuing, RIE processing using $O_2$ is performed on the resist layer 708 of the foundation using the silica fine particles 709 as an etching mask. Thereby, as illustrated in FIG. 11E, a resist pattern 708A having the columnar configuration having a high aspect ratio is obtained.

Then, as illustrated in FIG. 11F, the p-type GaP layer 705 is etched using the remaining silica particles 709 and resist pattern 708A as a mask using an inductively coupled plasma (ICP)-RIE apparatus. The etching conditions are a flow rate of $Cl_2$ of 5 sccm, a flow rate of Ar of 15 sccm, a pressure of 0.7 Pa, a bias of 100 W, and an ICP of 30 W. By this etching, the recessed portions 710 are made in the p-type GaP layer 705.

Continuing as illustrated in FIG. 11G, a metal multilayered film 711 is formed in the recessed portions 710 of the p-type GaP layer 705 using vacuum vapor deposition. The metal multilayered film 711 includes a Au film having a thickness of 10 nm and a Au—Zn alloy film having a thickness of 30 nm. The metal multilayered film 711 is not provided on the protruding portions of the p-type GaP layer 705. The metal multilayered film 711 becomes an electrode layer 711A in which opening portions are provided corresponding to the protruding portions.

Figure 11H:
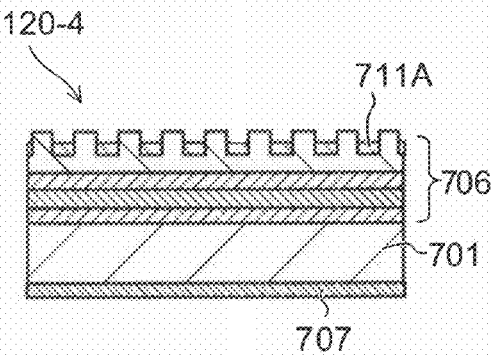

Continuing by removing the remaining resist pattern 708A using ashing as illustrated in FIG. 11H, a configuration is formed in which the protruding portions of the p-type GaP layer 705 pierce the opening portions of the electrode layer 711A.

At this time, the average distance between the adjacent opening portions made in the electrode layer 711A was 400 nm; and the height of the protruding portions formed in the p-type GaP layer 705 was 100 nm.

Subsequently, sintering is performed using the conditions of 450° C. for 30 minutes in a nitrogen atmosphere. Thereby, ohmic contacts are formed between the n-type GaAs substrate 701 and the electrode layer 707 and between the p-type GaP layer 705 and the electrode layer 711A.

Further, a round pad electrode (not illustrated) made of Au is formed on a portion of the electrode layer 711A. Thereby, the semiconductor light emitting device 120-4 according to the fourth example is completed.

The semiconductor light emitting device 120-4 according to the fourth example and the semiconductor light emitting devices according to the comparative examples 1-1 and 1-2 were diced into 1 mm×1 mm chips; and luminance measurements were performed in the bare chip state using a chip tester.

The semiconductor light emitting devices were compared using the maximum luminance. In the case that the maximum luminance of the semiconductor light emitting device according to the comparative example 1-1 was taken to be unity, the maximum luminance of the semiconductor light emitting device according to the comparative example 1-2 was 1.2 and the maximum luminance of the semiconductor light emitting device 120-4 according to the fourth example was 1.3.

Fifth Example

FIGS. 12A to 12H are schematic cross-sectional views illustrating a method for manufacturing a semiconductor light emitting device according to a fifth example.

In the fifth example, a semiconductor light emitting device 120-5 according to the second embodiment is formed using the method using the self-assembly block copolymer of (B) recited above. The light emission wavelength of the semiconductor light emitting device 120-5 is 630 nm.

Figure 12A:
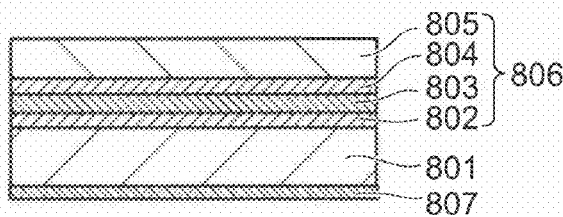

First, as illustrated in FIG. 12A, similarly to the fourth example, a semiconductor multilayered film 806 is formed by sequentially forming an n-type InGaAlP layer 802, an InGaAlP layer 803, a p-type InGaAlP layer 804, and a p-type GaP layer 805 on an n-type GaAs substrate 801.

Further, an electrode layer 807 used to form the second electrode layer 30 is formed on the back face of the n-type GaAs substrate 801 using vacuum vapor deposition. The electrode layer 807 includes a Au—Ge alloy having a thickness of 150 nm.

Figure 12E:
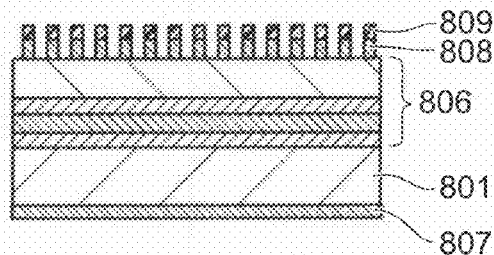
Figure 12B:
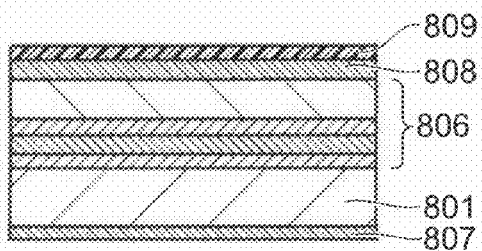

Then, as illustrated in FIG. 12B, a resist layer 808 is formed on the p-type GaP layer 805. The thickness of the resist layer 808 is 170 nm. Then, a SOG layer 809 is formed thereon. The thickness of the SOG layer 809 is 30 nm.

Continuing, a solution is made by diluting a PS-PMMA block copolymer (PS molecular weight: 265,000 and PMMA molecular weight: 630,000) to have a concentration of 4.0 wt % in PGMEA; and a PMMA homopolymer (molecular weight=2000) and a PS homopolymer (Mn=molecular weight) are each diluted to have a concentration of 4.0 wt % in PGMEA.

Then, each of the solutions is filtered using a 0.2 μm mesh; and a resin composition solution containing a block copolymer is prepared by weighing on a balance to have a weight ratio of 4 (PS-PMMA):6 (PMMA):1 (PS).

Continuing, the solution is spin-coated onto the SOG layer 809 at 3000 rpm. Then, heating is performed on a hotplate. The heating conditions are 110° C. for 90 seconds. Subsequently, the phase separation annealing is performed using the conditions of 250° C. for 8 hours in a nitrogen atmosphere in an oven. As illustrated in FIG. 12C, the obtained phase separation pattern was a morphology in which a microdomain 810A having a dot configuration of PS existed in a matrix 810B of PMMA.

Then, similarly to the second example, RIE processing is performed on the obtained diblock copolymer layer using a gas mixture of oxygen and argon. Thereby, as illustrated in FIG. 12D, the PMMA matrix 810B is removed to expose PS dots 810C.

Subsequently, RIE processing is performed on the SOG layer 809 using the PS dots 810C as a mask. A gas mixture of $CF_4$ and $CHF_3$ was used in the RIE. Thereby, as illustrated in FIG. 12E, a circular columnar pattern of the SOG is formed;

and a pillar pattern of the SOG/resist is formed by further etching the resist layer 808 of the foundation by RIE processing using oxygen.

Figure 12F:
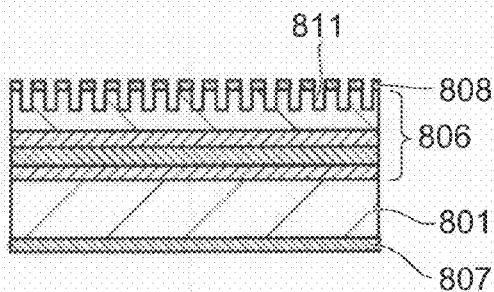
Figure 12C:
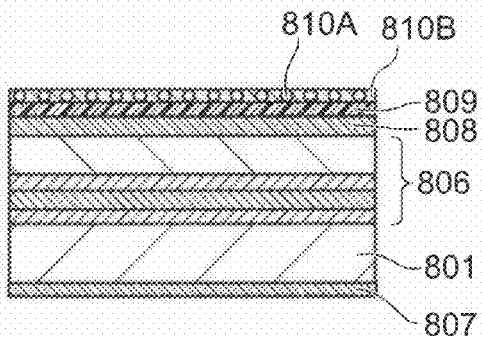

Then, as illustrated in FIG. 12F, similarly to the fourth example, the recessed portions 811 are made in the p-type GaP layer 805 by performing ICP-RIE processing on the p-type GaP layer 805 of the lower layer using the pillars of the formed SOG/resist as a mask.

Figure 12G:
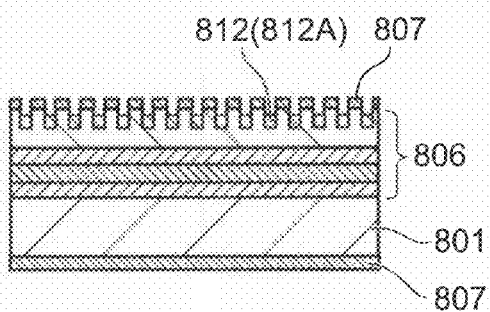
Figure 12D:
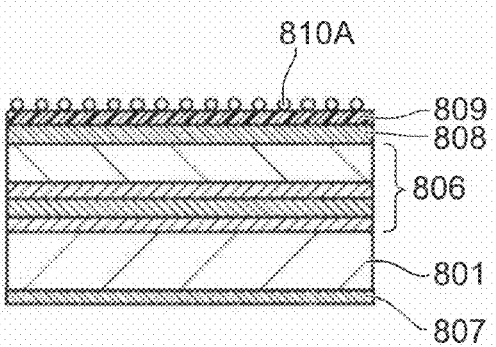

Subsequently, a metal multilayered film 812 is formed in the etched recessed portions 811 of the p-type GaP layer 805 using vacuum vapor deposition. As illustrated in FIG. 12G, the metal multilayered film 812 includes a Au film having a thickness of 10 nm and a Au—Zn alloy film having a thickness of 30 nm. The metal multilayered film 812 is not provided on the protruding portions of the p-type GaP layer 805. The metal multilayered film 812 becomes an electrode layer 812A in which opening portions are provided corresponding to the protruding portions.

Figure 12H:
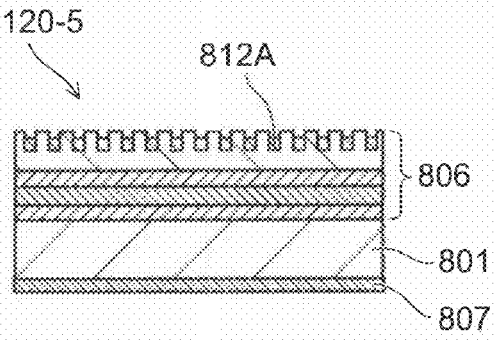

Continuing, the remaining SOG mask is removed using dilute hydrofluoric acid. The resist mask is removed using ashing. Thereby, as illustrated in FIG. 12H, a configuration is formed in which the protruding portions of the p-type GaP layer 805 pierce the opening portions of the electrode layer 812A.

At this time, the diameter of the opening portion made in the electrode layer 812A was 50 nm and the average distance between the adjacent opening portions was 150 nm. The height of the protruding portion formed in the p-type GaP layer 805 was 100 nm.

Subsequently, sintering is performed using the conditions of 450° C. for 30 minutes in a nitrogen atmosphere. Thereby, ohmic contacts are formed between the n-type GaAs substrate 801 and the electrode layer 807 and between the p-type GaP layer 805 and the electrode layer 812A.

Further, a round pad electrode (not illustrated) made of Au is formed on a portion of the electrode layer 812A. Thereby, the semiconductor light emitting device 120-5 according to the fifth example is completed.

As a comparative example 5-1, a semiconductor light emitting device was manufactured in which the electrode layer 812A including the opening portions similar to that of the fifth example is provided but the protruding portions are not made in the p-type GaP layer 805.

The semiconductor light emitting device 120-5 according to the fifth example and the semiconductor light emitting devices according to the comparative examples 1-1 and 5-1 were diced into 1 mm×1 mm chips; and luminance measurements were performed in the bare chip state using a chip tester.

The semiconductor light emitting devices were compared using the maximum luminance. In the case where the maximum luminance of the semiconductor light emitting device according to the comparative example 1-1 was taken to be unity, the maximum luminance of the semiconductor light emitting device according to the comparative example 5-1 was 1.2 and the maximum luminance of the semiconductor light emitting device 120-5 according to the fifth example was 1.4.

Sixth Example

FIGS. 13A to 13G are schematic cross-sectional views illustrating a method for manufacturing a semiconductor light emitting device according to a sixth example.

In the sixth example, a semiconductor light emitting device 120-6 according to the second embodiment is manufactured using the method utilizing the stamper of (C) recited above. The light emission wavelength of the semiconductor light emitting device 120-6 is 630 nm.

Figure 13A:
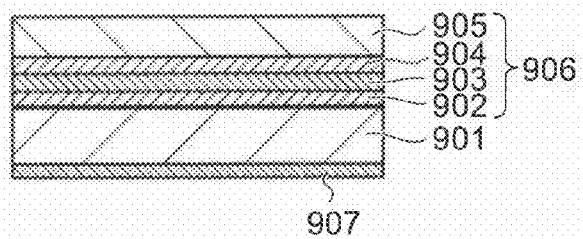

First, as illustrated in FIG. 13A, similarly to the fourth example, a semiconductor multilayered film 906 is formed by sequentially forming an n-type InGaAlP layer 902, an InGaAlP layer 903, a p-type InGaAlP layer 904, and a p-type GaP layer 905 on an n-type GaAs substrate 901. Similarly to the fourth example, an electrode layer 907 used to form the second electrode layer 30 is formed on the back face of the n-type GaAs substrate 901 using vacuum vapor deposition.

Figure 13D:
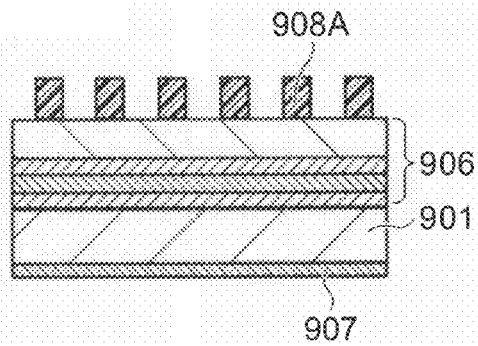
Figure 13B:
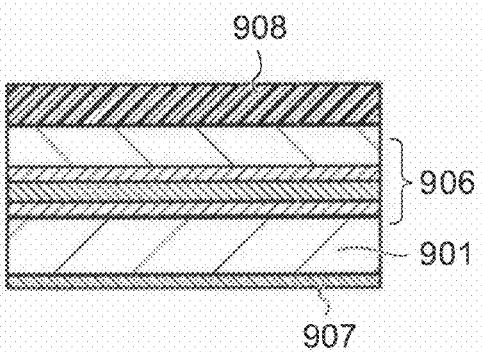
Figure 13E:
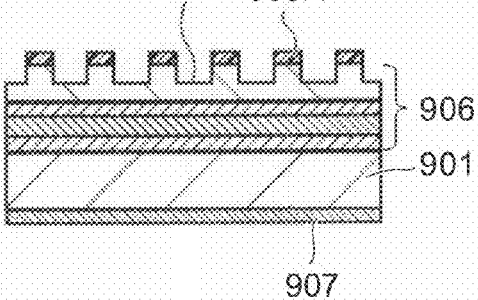
Figure 13C:
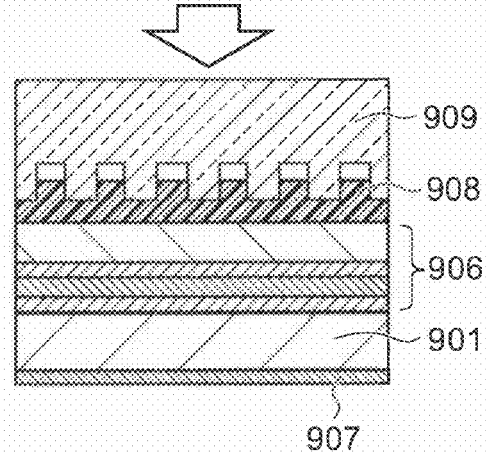

Then, as illustrated in FIG. 13B, a resist layer 908 similar to that of the third example is formed on the p-type GaP layer 905. The film thickness of the resist layer 908 was about 170 nm. Further, as illustrated in FIG. 13C, the unevenness pattern of a quartz stamper 909, which is a mold, is pressed onto the mold. The stamper 909 is pressed onto the resist layer 908 using a heater plate press. Thereby, as illustrated in FIG. 13D, the unevenness pattern of the stamper 909 is transferred onto the resist layer 908 to form a pillar pattern 908A of the resist.

Here, the unevenness pattern of the stamper 909 is formed by patterning using electron beam lithography. Recessed portions having a depth of 120 nm and a diameter of 50 nm are arranged in the densest fillable arrangement with a period of 150 nm in the unevenness pattern.

Then, similarly to the fourth example, ICP-RIE processing is performed on the p-type GaP layer 905 using the pillar pattern 908A of the resist onto which the unevenness pattern is transferred as an etching mask. Thereby, as illustrated in FIG. 13E, the recessed portions 910 are made in the p-type GaP layer 905.

Figure 13F:
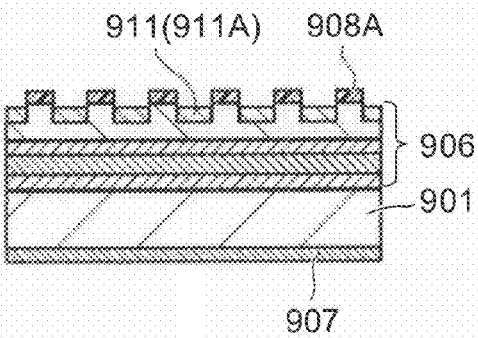
Figure 13G:
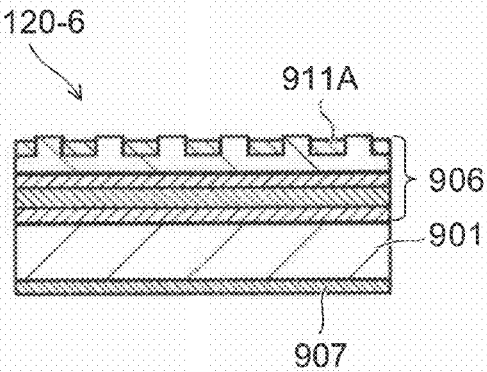

Subsequently, a metal multilayered film 911 is formed in the recessed portions 910 of the etched p-type GaP layer 905 using vacuum vapor deposition. As illustrated in FIG. 13F, the metal multilayered film 911 includes a Au film having a thickness of 10 nm and a Au—Zn alloy film having a thickness of 30 nm. The metal multilayered film 911 is not provided on the protruding portions of the p-type GaP layer 905. The metal multilayered film 911 becomes an electrode layer 911A in which opening portions are provided corresponding to the protruding portions.

Continuing, the remaining resist mask is removed using ashing. Thereby, by the electrode layer 911A, a configuration is formed in which the protruding portions of the p-type GaP layer 905 pierce the opening portions of the metal electrode layer.

At this time, the diameter of the opening portions made in the electrode layer 911A was 50 nm and the average distance between the adjacent opening portions was 150 nm. The height of the protruding portions formed in the p-type GaP layer 905 was 300 nm.

Subsequently, sintering is performed using the conditions of 450° C. for 30 minutes in a nitrogen atmosphere. Thereby, ohmic contacts are formed between the n-type GaAs substrate 901 and the electrode layer 907 and between the p-type GaP layer 905 and the electrode layer 911A.

Further, a round pad electrode (not illustrated) made of Au is formed on a portion of the electrode layer 911A. Thereby, the semiconductor light emitting device 120-6 according to the sixth example is completed.

The semiconductor light emitting device 120-6 according to the sixth example and the semiconductor light emitting devices according to the comparative examples 1-1 and 3-1 were diced into 1 mm×1 mm chips; and luminance measurements were performed in the bare chip state using a chip tester.

The semiconductor light emitting devices were compared using the maximum luminance. In the case that the maximum luminance of the semiconductor light emitting device according to the comparative example 1-1 was taken to be unity, the maximum luminance of the semiconductor light emitting device according to the comparative example 3-1 was 1.2 and the maximum luminance of the semiconductor light emitting device 120-6 according to the sixth example was 1.5.

Seventh Example

In the seventh example, a semiconductor light emitting device having a different light emission wavelength is manufactured using a manufacturing method similar to that of the third example. The light emission wavelength of the semiconductor light emitting device according to the seventh example is 440 nm.

In the semiconductor light emitting device according to the seventh example, the material qualities and the configuration of the semiconductor multilayered film are different from those of the semiconductor light emitting device 110-3 according to the third example.

In other words, the semiconductor multilayered film applied in the semiconductor light emitting device has a configuration in which an n-type GaN layer, which is a buffer layer formed by MOCVD, an n-type GaN layer, which is a clad layer, a MQW layer made of InGaN/GaN, which is a light emitting layer, a p-type AlGaN layer, which is a clad layer, and a p-type GaN layer, which is a contact layer, are sequentially formed on an n-type GaN substrate.

Continuing, a p-side electrode layer including Ni (with a thickness of 5 nm)/Au (with a thickness of 30 nm) is formed on the p-type contact layer using vacuum vapor deposition.

An n-side electrode layer including Ti (with a thickness of 10 nm)/Au (with a thickness of 100 nm) is formed on the back face of the n-type GaN substrate and patterned into the desired configuration. Finally, heat treatment is performed to form an ohmic contact in the contact surface between the electrode layers and the semiconductor layers respectively.

Then, a resist layer similar to that of the third example is formed on the p-side electrode layer. Subsequently, an unevenness pattern is transferred onto the resist layer using a quartz stamper which is a mold. The unevenness pattern of the stamper is formed by patterning using electron beam lithography. Pillars having a height of 120 nm and a diameter of 60 nm are arranged in the densest fillable arrangement with a period of 100 nm in the unevenness pattern formed in the stamper.

Similarly to the example of FIGS. 1A and 1B, milling was performed on the p-side electrode layer and the p-type GaN layer which is the contact layer using the pattern of the resist formed by the stamper as an etching mask.

At this time, the average distance between the adjacent opening portions made in the p-side electrode layer was 100 nm. The depth of the recessed portions of the p-type GaN layer which is the contact layer was 30 nm.

Then, the remaining resist mask is removed using ashing. A round pad electrode made of Ti/Au is formed on a portion of the p-side electrode layer. Thereby, the semiconductor light emitting device according to the seventh example is completed.

As a comparative example 7-1, a semiconductor light emitting device is manufactured in which the semiconductor light emitting device is similar to that of the seventh example except that the p-side electrode layer including the opening portions and the recessed portions of the contact layer are not provided and only the round pad electrode is provided on the contact layer.

As a comparative example 7-2, a semiconductor light emitting device is manufactured in which the semiconductor light emitting device is similar to that of the seventh example except that recessed portions are not made on the contact layer.

The semiconductor light emitting device according to the seventh example and the semiconductor light emitting devices according to the comparative examples 7-1 and 7-2 were diced into 300 μm-square chips; and luminance measurements were performed in the bare chip state using a chip tester. The semiconductor light emitting devices were compared using the maximum luminance. In the case where the maximum luminance of the semiconductor light emitting device according to the comparative example 7-1 was taken to be unity, the maximum luminance of the semiconductor light emitting device according to the comparative example 7-2 was 1.1 and the maximum luminance of the semiconductor light emitting device 110-7 according to the seventh example was 1.3.

Eighth Example

FIGS. 14A to 14F are schematic cross-sectional views illustrating a method for manufacturing a semiconductor light emitting device according to an eighth example.

In the eighth example, a semiconductor light emitting device 110-8 according to the first embodiment is manufactured using the method utilizing the stamper of (C) recited above. The light emission wavelength of the semiconductor light emitting device 120-6 is 440 nm. In the semiconductor light emitting device 110-8, the second electrode layer 30 is provided on the upper side which is the same side as the first electrode layer 20.

Figure 14A:
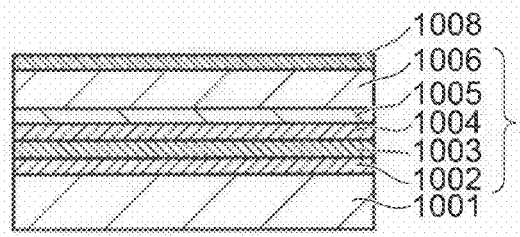

First, as illustrated in FIG. 14A, an n-type GaN layer 1002 is formed as a buffer layer on a sapphire substrate 1001. Then, a semiconductor multilayered film 1007 is formed by forming an n-type GaN layer 1003, a MQW layer 1004 made of InGaN/GaN, a p-type AlGaN layer 1005, and a p-type GaN layer 1006 in order on the n-type GaN layer 1002.

Continuing, a metal multilayered film 1008 is formed on the p-type GaN layer using vacuum vapor deposition. The metal multilayered film 1008 includes Ni having a thickness of 5 nm and Ag having a thickness of 30 nm (referring to FIG. 14A).

Figure 14D:
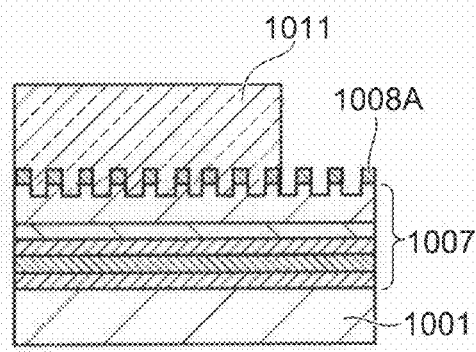
Figure 14B:
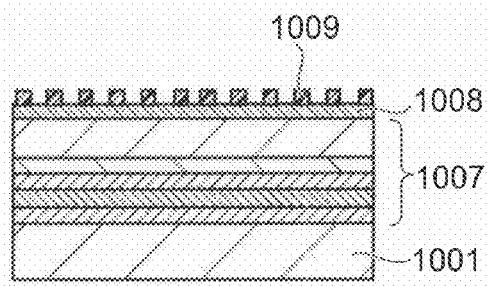
Figure 14E:
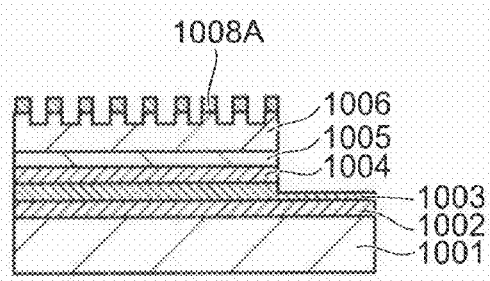
Figure 14C:
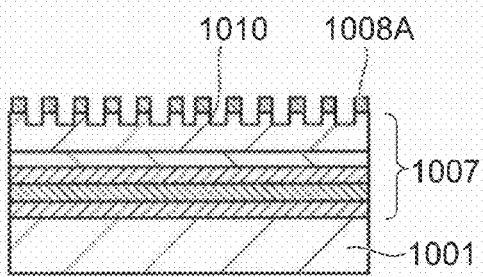

Then, as illustrated in FIG. 14B, similarly to the third example, a resist pattern 1009 is formed on the metal multilayered film 1008 by utilizing a stamper. Continuing, similarly to the first example, opening portions 1010 are made in the metal multilayered film 1008 using ion milling. The metal multilayered film 1008 in which the opening portions 1010 are made becomes a p-side electrode 1008A. As illustrated in FIG. 14C, recessed portions are made in the p-type GaN layer 1006 by further continuing the ion milling. At this time, the diameter of the opening portions 1010 was 120 nm; and the average distance between the adjacent opening portions was 200 nm. The depth of the recessed portions was 100 nm.

Continuing as illustrated in FIG. 14D, a resist layer 1011 is formed on a portion of the surface of the metal multilayered film 1008 using lithography; and etching is performed subsequently until the n-type GaN layer 1003 is exposed using ICP-RIE. Subsequently, as illustrated in FIG. 14E, the remaining resist layer 1011 is removed using ashing.

Then, an n-side electrode 1012 is formed on an exposed portion of the surface of the n-type GaN layer 1003. A pad electrode 1013 is formed on a portion of the surface of the p-side electrode 1008A.

Figure 14F:
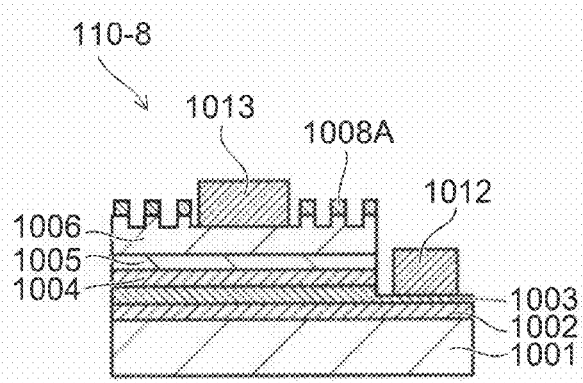

Finally, rapid high-temperature annealing is performed to form an ohmic contact between the electrode layers and the semiconductors. Thereby, as illustrated in FIG. 14F, the semiconductor light emitting device 110-8 according to the eighth example is completed.

As a comparative example 8-1, a semiconductor light emitting device is constructed in which the semiconductor light emitting device is similar to that of the eighth example except that the p-side electrode including the opening portions and the recessed portions of the p-type GaN layer are not provided and only the round pad electrode is provided on the p-type GaN layer.

As a comparative example 8-2, a semiconductor light emitting device is manufactured in which the semiconductor light emitting device is similar to that of the eighth example except that the opening portions 1010 (the recessed portions) are not made in the p-type GaN contact layer.

The semiconductor light emitting device 110-8 according to the eighth example and the semiconductor light emitting devices according to the comparative examples 8-1 and 8-2 were diced into 500 μm-square chips; and luminance measurements were performed in the bare chip state using a chip tester.

The semiconductor light emitting devices were compared using the maximum luminance. In the case that the maximum luminance of the semiconductor light emitting device according to the comparative example 8-1 was taken to be unity, the maximum luminance of the semiconductor light emitting device according to the comparative example 8-2 was 1.3 and the maximum luminance of the semiconductor light emitting device 110-8 according to the eighth example was 1.5.

Although embodiments and examples are described above, the invention is not limited to these examples. For example, although the first conductivity type is described as the n-type and the second conductivity type is described as the p-type, the invention is practicable even in the case where the first conductivity type is the p-type and the second conductivity type is the n-type.

As described above, according to a semiconductor light emitting device and a method for manufacturing the same according to the embodiments, a semiconductor light emitting device having a high luminance can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   a first semiconductor layer of a first conductivity type;
   a second semiconductor layer of a second conductivity type;
   a light emitting layer provided between the first semiconductor layer and the second semiconductor layer;
   a first electrode layer provided on a side of the second semiconductor layer opposite to the first semiconductor layer, the first electrode layer including a metal portion and a plurality of opening portions piercing the metal portion along a direction from the first semiconductor layer toward the second semiconductor layer, the metal portion contacting the second semiconductor layer, an equivalent circular diameter of a configuration of each of the plurality of opening portions as viewed along the direction being not less than 10 nanometers and not more than 5 micrometers; and
   a second electrode layer electrically connected to the first semiconductor layer,
   the second semiconductor layer including a protruding portion contacting the metal portion and a recessed portion recessed from the protruding portion along the direction at a bottom portion of the opening portion, the recessed portions corresponding to the opening portions.

2. The device according to claim 1, wherein $$Ad \leq \lambda \times (2/(n2+n0))$$

is satisfied, wherein
   d is a distance between two adjacent opening portions of the plurality of opening portions,
   Ad is an average of the distance d of the plurality of opening portions,
   λ is a wavelength of light emitted from the light emitting layer,
   n2 is a refractive index of the second semiconductor layer with respect to the light, and
   n0 is a refractive index with respect to the light of a medium outside the second semiconductor layer.

3. The device according to claim 1, wherein a difference between a thickness of the protruding portion along the direction and a thickness of the recessed portion along the direction is not more than a wavelength of light emitted from the light emitting layer.

4. The device according to claim 1, wherein a thickness of the metal portion along the direction is not less than 10 nanometers and not more than 50 nanometers.

5. The device according to claim 1, wherein the first electrode layer includes at least one selected from Ag, Au, Al, Zn, Zr, Si, Ge, Pt, Rh, Ni, Pd, Cu, Sn, C, Mg, Cr, Te, Se, and Ti.

6. The device according to claim 1, wherein the first electrode layer has an ohmic contact with the second semiconductor layer.

7. The device according to claim 1, wherein a sheet resistance of the first electrode layer is not more than 10 ohm/□.

8. A semiconductor light emitting device, comprising:
   a first semiconductor layer of a first conductivity type;
   a second semiconductor layer of a second conductivity type including a recessed portion and a protruding portion, the recessed portion being provided on a side of the second semiconductor layer opposite to the first semiconductor layer, the protruding portion protruding from the recessed portion along a direction from the first semiconductor layer toward the second semiconductor layer, an equivalent circular diameter of a configuration of the protruding portion as viewed from the direction being not less than 10 nanometers and not more than 5 micrometers;
   a light emitting layer provided between the first semiconductor layer and the second semiconductor layer;
   a first electrode layer including a metal portion filled into the recessed portion, the metal portion not provided on the protruding portion; and
   a second electrode layer electrically connected to the first semiconductor layer.

9. The device according to claim 8, wherein $$Ad \leq \lambda \times (2/(n2+n0))$$

is satisfied, wherein
- d is a distance between two adjacent opening portions of the plurality of opening portions,
- Ad is an average of the distance d of the plurality of opening portions,
- $\lambda$ is a wavelength of light emitted from the light emitting layer,
- n2 is a refractive index of the second semiconductor layer with respect to the light, and
- n0 is a refractive index with respect to the light of a medium outside the second semiconductor layer.

10. The device according to claim 8, wherein a difference between a thickness of the protruding portion along the direction and a thickness of the recessed portion along the direction is not more than a wavelength of light emitted from the light emitting layer.

* * * * *